United States Patent
Judkins, III et al.

(10) Patent No.: US 9,897,464 B2
(45) Date of Patent: *Feb. 20, 2018

(54) MAGNETIC FIELD SENSOR TO DETECT A MAGNITUDE OF A MAGNETIC FIELD IN ANY DIRECTION

(71) Applicant: Allegro MicroSystems, LLC, Worcester, MA (US)

(72) Inventors: Joseph James Judkins, III, Bedford, NH (US); Ryan Jon Metivier, Nashua, NH (US); Gerardo A. Monreal, Buenos Aires (AR); Bruno Luis Uberti, Buenos Aires (AR)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/638,876

(22) Filed: Jun. 30, 2017

(65) Prior Publication Data

US 2017/0307407 A1    Oct. 26, 2017

Related U.S. Application Data

(63) Continuation of application No. 14/830,098, filed on Aug. 19, 2015, which is a continuation-in-part of
(Continued)

(51) Int. Cl.
*G01R 33/07*    (2006.01)
*G01R 33/09*    (2006.01)
(Continued)

(52) U.S. Cl.
CPC ............... *G01D 5/142* (2013.01); *G01B 7/14* (2013.01); *G01D 5/16* (2013.01); *G01R 33/0023* (2013.01); *G01R 33/0206* (2013.01); *G01R 33/07* (2013.01)

(58) Field of Classification Search
CPC ..................................................... G01R 33/07
(Continued)

(56) References Cited

U.S. PATENT DOCUMENTS 3,846,697 A    11/1974    Cila et al.
4,204,158 A     5/1980    Ricouard et al.
(Continued)

FOREIGN PATENT DOCUMENTS

DE    10 2006 037 226 A1    2/2008
EP         0 631 413 A2    12/1994
(Continued)

OTHER PUBLICATIONS

Allegro Data Sheet 3235; "Dual-Output Hall-Effect Switch;" Jan. 1995; 9 Pages.
(Continued)

*Primary Examiner* — Bot Ledynh
(74) *Attorney, Agent, or Firm* — Daly, Crowley, Mofford & Durkee, LLP

(57) ABSTRACT

In one aspect, a magnetic field sensor includes first and second magnetic field sensing elements having respective first and second maximum response axes. The first and second maximum response axes point along respective first and second different coordinate axes. In response to a magnetic field, the first and second magnetic field sensing elements are operable to generate first and second magnetic field signals. The magnetic field sensor includes an electronic circuit coupled to receive the first and the second magnetic field signals. The electronic circuit is configured to determine a magnitude of a vector sum of the first and the second magnetic field signals and provide one or more signals in response to the magnitude of the vector sum determined.

27 Claims, 18 Drawing Sheets

Related U.S. Application Data application No. 14/277,218, filed on May 14, 2014, now Pat. No. 9,664,752.

(60) Provisional application No. 61/827,280, filed on May 24, 2013.

(51) Int. Cl.

| | |
|---|---|
| G01D 5/14 | (2006.01) |
| G01R 33/02 | (2006.01) |
| G01B 7/14 | (2006.01) |
| G01D 5/16 | (2006.01) |
| G01R 33/00 | (2006.01) |

(58) Field of Classification Search
USPC .......................................................... 324/251
See application file for complete search history.

(56) References Cited

U.S. PATENT DOCUMENTS

| | | | |
|---|---|---|---|
| 4,296,410 | A | 10/1981 | Higgs et al. |
| 4,349,814 | A | 9/1982 | Akehurst |
| 4,355,209 | A | 10/1982 | Sabon |
| 4,745,363 | A | 5/1988 | Carr et al. |
| 4,761,569 | A | 8/1988 | Higgs |
| 4,859,941 | A | 8/1989 | Higgs et al. |
| 4,966,041 | A | 10/1990 | Miyazaki |
| 5,402,064 | A | 3/1995 | Eck et al. |
| 5,442,283 | A | 8/1995 | Vig et al. |
| 5,493,690 | A | 2/1996 | Shimazaki |
| 5,541,562 | A | 7/1996 | Fletcher et al. |
| 5,570,016 | A | 10/1996 | Schroeder et al. |
| 5,629,622 | A | 5/1997 | Scampini |
| 5,666,410 | A | 9/1997 | McLane |
| 5,686,894 | A | 11/1997 | Vig et al. |
| 5,789,915 | A | 8/1998 | Ingraham |
| 5,861,796 | A | 1/1999 | Benshoff |
| 5,867,021 | A | 2/1999 | Hancock |
| 6,014,008 | A | 1/2000 | Hartzell et al. |
| 6,035,211 | A | 5/2000 | Rabe et al. |
| 6,356,741 | B1 | 3/2002 | Bilotti et al. |
| 6,622,012 | B2 | 9/2003 | Bilotti et al. |
| 7,085,119 | B2 | 8/2006 | Bilotti et al. |
| 7,307,824 | B2 | 12/2007 | Bilotti et al. |
| 7,768,083 | B2 | 8/2010 | Doogue et al. |
| 7,990,209 | B2 | 8/2011 | Romero |
| 8,222,888 | B2 | 7/2012 | David et al. |
| 8,564,285 | B2 | 10/2013 | Romero et al. |
| 8,629,520 | B2 | 1/2014 | Doogue et al. |
| 8,680,846 | B2 | 3/2014 | Cesaretti et al. |
| 9,733,106 | B2 | 8/2017 | Judkins, III et al. |
| 2003/0107510 | A1 | 6/2003 | Gartner et al. |
| 2006/0097715 | A1 | 5/2006 | Oohira et al. |
| 2009/0251316 | A1 | 10/2009 | Mamourian et al. |
| 2011/0031968 | A1 | 2/2011 | Cantave et al. |
| 2011/0234218 | A1 | 9/2011 | Lagouge |
| 2011/0248790 | A1 | 10/2011 | Tsvey |
| 2013/0057257 | A1 | 3/2013 | Friedrich et al. |
| 2014/0009144 | A1 | 1/2014 | Romero |
| 2014/0225598 | A1 | 8/2014 | Romero et al. |
| 2014/0239942 | A1 | 8/2014 | Schaaf |
| 2014/0347044 | A1 | 11/2014 | Monreal et al. |

FOREIGN PATENT DOCUMENTS

| | | |
|---|---|---|
| JP | 62-48160 | 3/1987 |
| JP | 7-15493 | 1/1995 |
| JP | 9-294060 | 11/1997 |
| JP | 7-83699 | 3/1998 |
| WO | WO 2014/189733 A1 | 11/2014 |

OTHER PUBLICATIONS

AsahiKasei; "AK8777B Hall Effect IC for Pulse Encoders;" Distributed by GMW Associates; Sep. 2012; 10 Pages.

Kejik et al.; "First Fully CMOS-Integrated 3D Hall Probe;" 13$^{th}$ International Conference on Solid-State Sensors, Actuators and Microsystems; Jun. 5-9, 2005; 4 Pages.

Office Action dated Jul. 9, 2001 for corresponding U.S. Appl. No. 09/338,668; 8 Pages.

Response to Office Action dated Jul. 9, 20101 corresponding to U.S. Appl. No. 09/338,668; Response filed Oct. 9, 2010; 20 Pages.

Office Action dated Dec. 31, 2002 corresponding to for U.S. Appl. No. 09/997,148; 8 Pages.

Terminal Disclaimer dated Mar. 31, 2003 corresponding to U.S. Appl. No. 09/997,148; 2 Pages.

Response to Office Action dated Dec. 31, 2002 corresponding to U.S. Appl. No. 09/997,148; Response filed Mar. 31, 2003; 14 Pages.

Image File Wrapper downloaded May 21, 2014 corresponding to U.S. Pat. No. 7,085,119; dated Aug. 1, 2006; 188 Pages.

Image File Wrapper downloaded May 21, 2014 corresponding to U.S. Pat. No. 7,307,824; dated Dec. 11, 2007; 102 Pages.

Ramsden, "Hall-Effect Sensors: Theory and Applications;" ISBN: 978-0-75-067934-3; XP055039221; Jan. 1, 2006; 253 Pages.

PCT International Search Report and Written Opinion dated Sep. 4, 2014 corresponding to PCT International Application No. PCT/US2014/037967; 18 Pages.

Monreal et al., "Magnetic Field Sensor for Detecting a Magnetic Field in Any Direction Above Thresholds;" filed May 14, 2014 corresponding to U.S. Appl. No. 14/277,218; 35 Pages.

Preliminary Amendment dated Nov. 6, 2014 corresponding to U.S. Appl. No. 14/277,218; 12 Pages.

Image File Wrapper (Part 1 of 6) downloaded Aug. 13, 2015 corresponding to U.S. Appl. No. 14/277,218; 150 Pages.

Image File Wrapper (Part 2 of 6) downloaded Aug. 13, 2015 corresponding to U.S. Appl. No. 14/277,218; 150 Pages.

Image File Wrapper (Part 3 of 6) downloaded Aug. 13, 2015 corresponding to U.S. Appl. No. 14/277,218; 150 Pages.

Image File Wrapper (Part 4 of 6) downloaded Aug. 13, 2015 corresponding to U.S. Appl. No. 14/277,218; 150 Pages.

Image File Wrapper (Part 5 of 6) downloaded Aug. 13, 2015 corresponding to U.S. Appl. No. 14/277,218; 150 Pages.

Image File Wrapper (Part 6 of 6) downloaded Aug. 13, 2015 corresponding to U.S. Appl. No. 14/277,218; 98 Pages.

PCT International Preliminary Report on Patentability and Written Opinion of the ISA dated Dec. 3, 2015; For PCT Pat. App. No. PCT/US2014/037967; 14 Pages.

Office Action dated Jul. 21, 2016 for U.S. Appl. No. 14/277,218; 16 pages.

Response (with amended claims) to European Office Action dated Jan. 11, 2016 for European Pat. App. No. 14730350.7; Response filed Jul. 7, 2016; 22 pages.

Response filed on Oct. 4, 2016 to Office Action dated Jul. 21, 2016, regarding U.S. Appl. No. 14/277,218; 18 pages.

PCT Search Report and Written Opinion of the ISA for PCT/US2016/044957, dated Oct. 13, 2016; 20 pages.

Sander et al., "Isotropic 3D Silicon Hall Sensor", from MEMS, 2015, Estoril, Portugal, Jan. 18, 2015; 4 pages.

Office Action dated Dec. 23, 2016 for U.S. Appl. No. 14/277,218; 24 pages.

Response to Dec. 23, 2016 Office Action from U.S. Appl. No. 14/277,218, filed Feb. 14, 2017; 18 Pages.

Notice of Allowance dated Apr. 12, 2017 for U.S. Appl. No. 14/277,218; 6 pages.

Notice of Allowance dated May 3, 2017 for U.S. Appl. No. 14/830,098; 7 Pages.

Response to U.S. Non-Final Office Action dated Feb. 3, 2017 for U.S. Appl. No. 14/830,098; Response filed Apr. 20, 2017; 16 Pages.

U.S. Non-Final Office Action dated Feb. 3, 2017 for U.S. Appl. No. 14/830,098; 34 Pages.

MAGNETIC FIELD SENSOR TO DETECT A MAGNITUDE OF A MAGNETIC FIELD IN ANY DIRECTION

CROSS REFERENCE TO RELATED APPLICATIONS

This application is a continuation of application of U.S. patent application Ser. No. 14/830,098, filed Aug. 19, 2015, entitled "MAGNETIC FIELD SENSOR TO DETECT A MAGNITUDE OF A MAGNETIC FIELD IN ANY DIRECTION," which is a continuation-in-part of U.S. patent application Ser. No. 14/277,218, filed May 14, 2014, entitled "MAGNETIC FIELD SENSOR FOR DETECTING A MAGNETIC FIELD IN ANY DIRECTION," which claims the benefit under 35 U.S.C. § 119(e) of U.S. Provisional Application No. 61/827,280 filed May 24, 2013. The applications cited in this paragraph are incorporated herein by reference in their entirety.

BACKGROUND

As is known, there are a variety of types of magnetic field sensing elements, including, but not limited to, Hall Effect elements, magnetoresistance elements, and magnetotransistors. As is also known, there are different types of Hall Effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall Effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Magnetic switches are used as examples herein. However, the circuits and techniques described herein apply also to any magnetic field sensor.

Conventional magnetic switches can sense a magnetic field above a threshold level in one dimension, i.e., along a line. Some conventional magnetic switches can sense a magnetic field above a threshold in two dimensions, i.e., in a plane.

SUMMARY

In one aspect, a magnetic field sensor includes first and second magnetic field sensing elements having respective first and second maximum response axes. The first and second maximum response axes point along respective first and second different coordinate axes. In response to a magnetic field, the first and second magnetic field sensing elements are operable to generate first and second magnetic field signals. The magnetic field sensor also includes an electronic circuit coupled to receive the first and the second magnetic field signals. The electronic circuit is configured to determine a magnitude of a vector sum of the first and the second magnetic field signals and provide one or more signals in response to the magnitude of the vector sum determined.

In another aspect, a magnetic field sensor includes first, second, and third magnetic field sensing elements having respective first, second and third maximum response axes. The first, second and third maximum response axes point along respective first, second, and third different coordinate axes. In response to a magnetic field, the first, second, and third magnetic field sensing elements are operable to generate first, second, and third magnetic field signals. The magnetic field sensor also includes an electronic circuit coupled to receive the first, the second and the third magnetic field signals. The electronic circuit is configured to determine a magnitude of a vector sum of the first, the second and the third magnetic field signals and provide one or more signals in response to the magnitude of the vector sum determined.

A method includes receiving a first magnetic field signal from a first magnetic field sensing element and receiving a second magnetic field signal from a second magnetic field sensing element. The first and second magnetic field sensing elements have respective first and second maximum response axes. The first second and second maximum response axes point along respective first and second different coordinate axes. In response to a magnetic field, the first and second magnetic field sensing elements are operable to generate the first and the second magnetic field signals. The method also includes determining a magnitude of a vector sum of the first and the second magnetic field signals and providing one or more signals in response to the magnitude of the vector sum determined.

BRIEF DESCRIPTION OF THE DRAWINGS

The foregoing features of the invention, as well as the invention itself may be more fully understood from the following detailed description of the drawings, in which.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type II/I-V semiconductor material like Gallium-Arsenide (GaAs) or an Indium compound, e.g., Indium-Antimonide (InSb).

As is known, some of the above-described magnetic field sensing elements tend to have an axis of maximum sensitivity in the plane of a substrate that supports the magnetic field sensing element, and others of the above-described magnetic field sensing elements tend to have an axis of maximum sensitivity normal to a substrate that supports the magnetic field sensing element. In particular, planar Hall elements tend to have axes of sensitivity normal to a substrate, while metal based or metallic magnetoresistance elements (e.g., GMR, TMR, AMR) and vertical Hall elements tend to have axes of sensitivity in the plane of the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figures 1, 2, 2A:
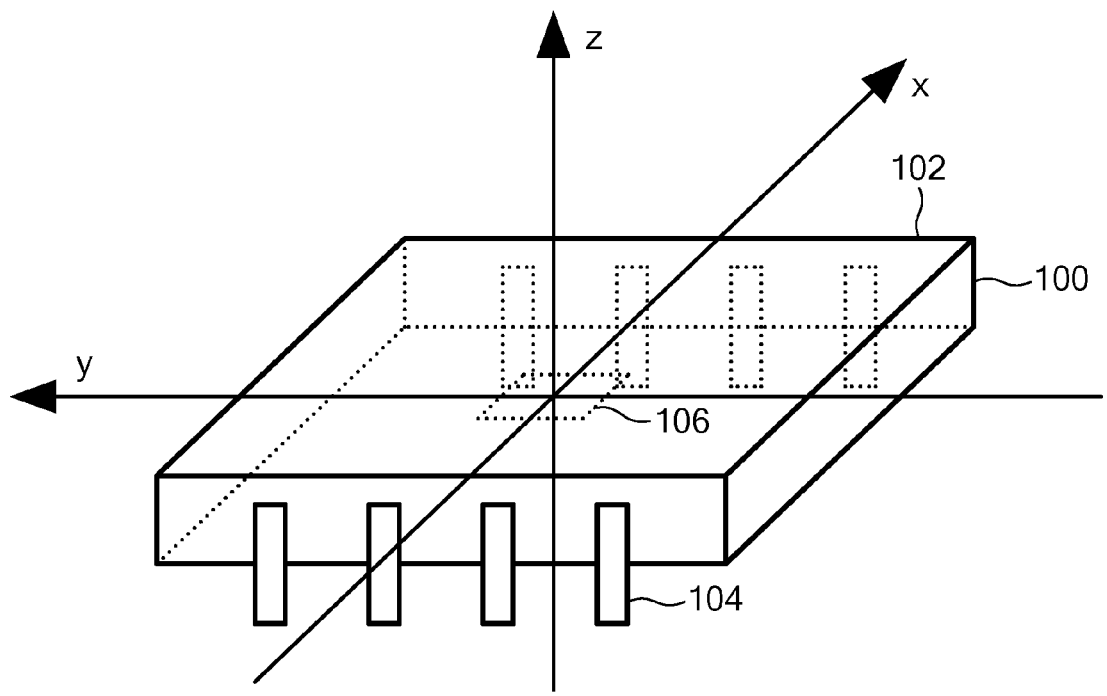
FIG. 1 is a pictorial showing an integrated circuit having a magnetic field sensor therein disposed upon a substrate, and showing three coordinate axes.
FIG. 2, which includes FIGS. 2A, 2B, and 2C in combination, is a block diagram showing an exemplary magnetic field sensor, in the form of a magnetic switch, which can be used as the magnetic field sensor of FIG. 1, which has a planar Hall element and two vertical Hall elements, and which has a so-called omni comparator.
Figure 2A:
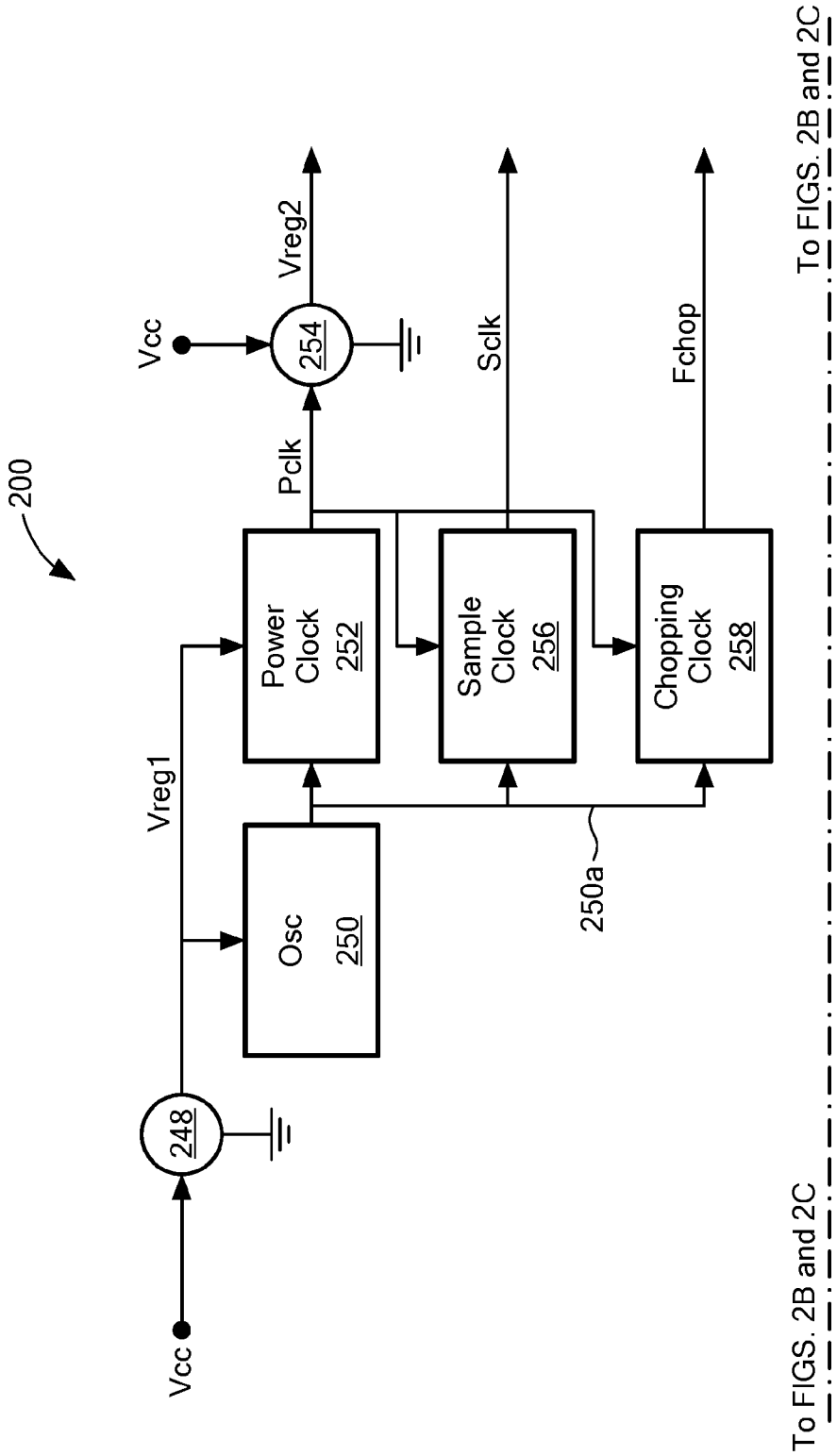
Figure 2B:
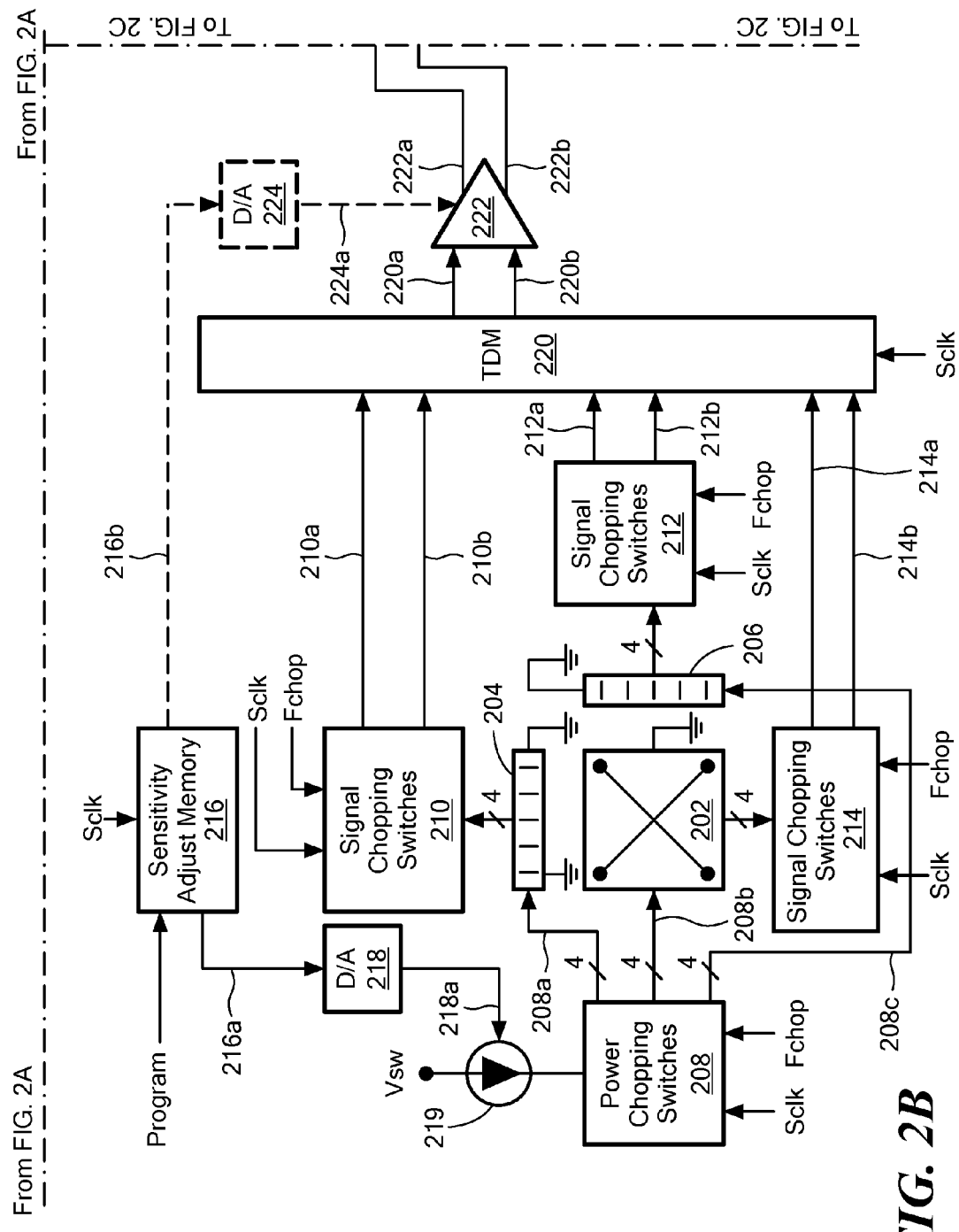
Figure 2C:
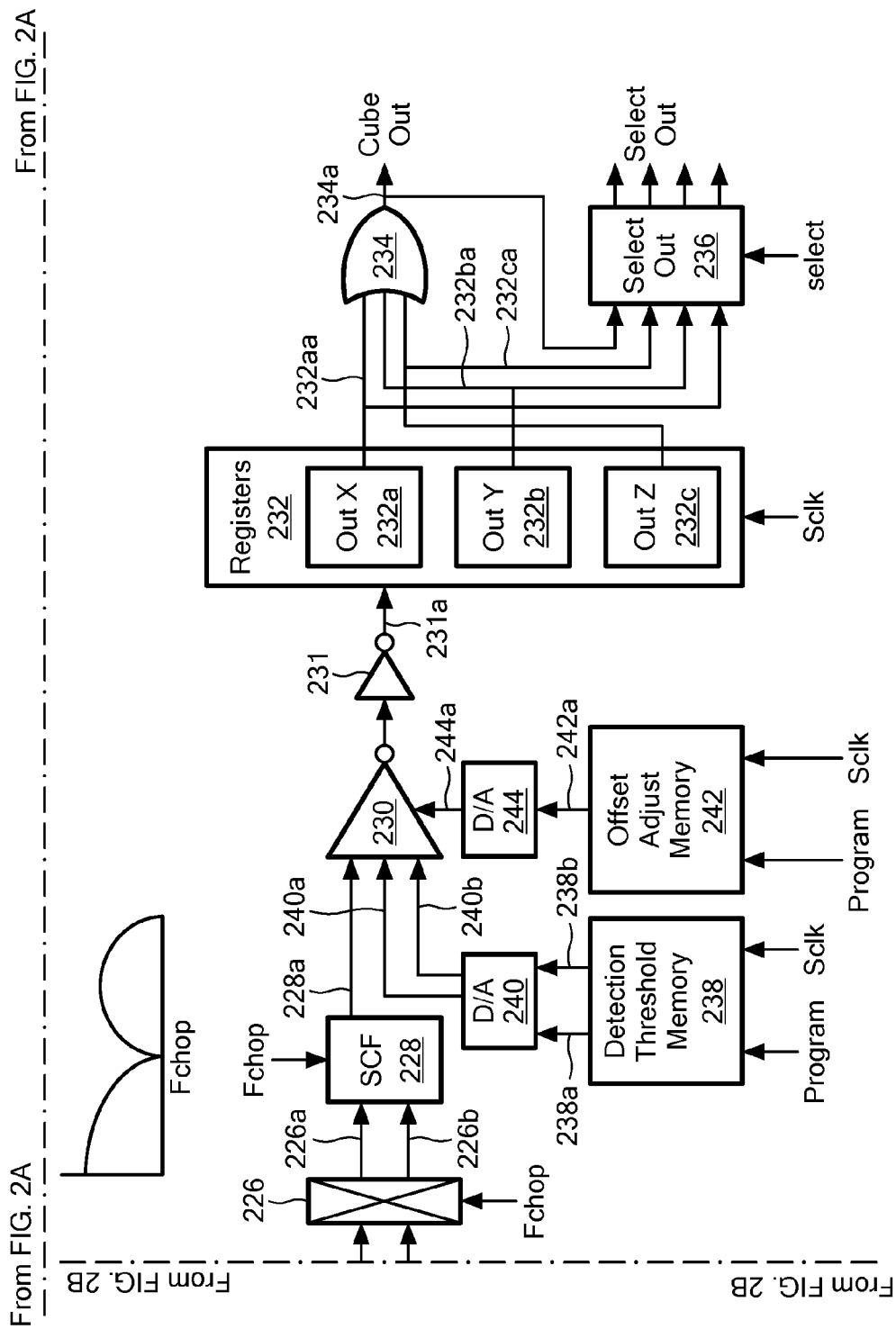

Referring to FIG. 1, an exemplary integrated circuit 100 includes a housing 102, for example, a plastic housing, a plurality of leads, of which a lead 104 is one example, and an integrated circuit substrate 106, for example, a semiconductor substrate upon which a magnetic field sensor can be disposed.

An x, y, z Cartesian coordinate system is shown and will be referenced in figures that follow.

Referring now to FIG. 2, an exemplary magnetic field sensor 200, in the form of magnetic switch, includes a planar (or horizontal) Hall element 202, which has a maximum response axis directed out of the page. The magnetic field sensor 200 also includes a first vertical Hall element 204 with a maximum response axis directed up and down on the page when the page is held in landscape mode. The magnetic field sensor 200 also includes a second vertical Hall element 206 with a maximum response axis directed right to left on the page when the page is held in landscape mode.

It is intended that the maximum response axis of the planar Hall element 202 points in the direction of the z-axis of FIG. 1. It is intended that the maximum response axis of the first vertical Hall element 204 points in the direction of the x-axis of FIG. 1. It is further intended that the maximum response axis of the second vertical Hall element 206 points in the direction of the y-axis of FIG. 1.

While orthogonal Cartesian coordinates are shown and described herein, it should be appreciated that orientations of the maximum response axes of the planar Hall element 202, the first vertical Hall element 204, and the second vertical Hall element 206 need not point in orthogonal directions. Orthogonal directions are merely used as an example herein.

It is known that Hall elements tend to generate an output voltage signal that has both a magnetically responsive signal portion and an unwanted DC offset signal portion. Current spinning (also referred to as chopping) is a known technique used to reduce the offset signal portion. Chopping can be applied to both planar Hall elements and vertical Hall elements. With chopping, selected drive and signal contact pairs are interchanged during each phase of the chopping.

Chopping tends to result in a frequency domain separation of the magnetically responsive signal portion of an output signal from a Hall element with respect to the offset signal portion of the output signal from the Hall element. In so-called "signal modulation," the magnetically responsive signal portion is shifted to a higher frequency and the offset signal portion remains at baseband. In so-called "offset modulation," the offset signal portion is shifted to a higher frequency and the magnetically responsive signal portion remains at baseband. For a planar Hall element, these two types of chopping are described, for example, in U.S. patent application Ser. No. 13/095,371, filed Apr. 27, 2011, entitled "Circuits and Methods for Self-Calibrating or Self-Testing a Magnetic Field Sensor." For a vertical Hall element, chopping is described in U.S. patent application Ser. No. 13/766,341, filed Feb. 13, 2013, entitled "MAGNETIC FIELD SENSOR AND RELATED TECHNIQUES THAT PRO- VIDE VARYING CURRENT SPINNING PHASE SEQUENCES OF A MAGNETIC FIELD SENSING ELEMENT." Both of these applications are assigned to the assignee of the present application and both are incorporated by reference herein in their entirety.

The signal modulation type chopping is described in figures herein. However, in other embodiments, the offset modulation type of chopping can be used.

Furthermore, magnetic field sensor are shown herein that employ chopping arrangements, in other embodiments, no chopping is used, In accordance with the above-described chopping, power chopping switches 208 apply chopped drive signals 208b to the planar Hall element 202, chopped drive signals 208a to the first vertical Hall element 204, and chopped drive signals 208c to the second vertical Hall element 206. The chopped drive signals change phases at a rate determined by a clock signal with a frequency, Fchop. The power chopping switches 208 also receive the sample clock, Sclk, signal. It will become apparent from discussion below in conjunction with FIG. 3 that the power chopping switches can decode the sample clock, Sclk, and can apply the chopped drive signals 208a, 208b, 208c sequentially and one at a time so that only one of the three Hall elements is operational at a time.

Also in accordance with the above-described chopping, signal chopping switches 214 select signal contacts of the planar Hall element 202, signal chopping switches 210 select signal contacts of the first vertical Hall element 204, and signal chopping switches 212 select signal contacts of the second vertical Hall element 212. As described in further detail below, the chopping, and operation of the planar Hall element 202, the first vertical Hall element 204, and the second vertical Hall element 206 occur from time to time in accordance with the sample clock, Sclk, received by the power chopping switches 208 and by the various signal chopping switches 210, 212, 214.

The signal chopping switches 210, 212, 214 are also coupled to receive the chopping frequency clock, Fchop, described more fully below.

A time division multiplex module 220 is coupled to receive three different differential signals 210a, 210b, and 212a, 212b, and 214a, 214b from the signal chopping switches 210, 212, 214. The time division multiplex module 220 is also coupled to receive the sample clock, Sclk. It will be appreciated that the three differential signals 210a, 210b, and 212a, 212b, and 214a, 214b are chopped signals, for which the magnetically responsive signal portion can be shifted to a higher frequency in accordance with the chopping frequency, Fchop. The unwanted offset signal portion remains at baseband within the three differential signals 210a, 210b, and 212a, 212b, and 214a, 214b.

While differential signals are described above and below, it will be appreciated that, in other embodiments, similar circuits can be designed that use single ended signals.

The time division multiplex module 220 is configured to sequentially select from among the three different differential signals 210a, 210b, and 212a, 212b, and 214a, 214b and to provide a differential sequential signal at an output therefrom, which is representative of sequential ones of the three differential signals 210a, 210b, and 212a, 212b, and 214a, 214b received by the time division multiplex module 220.

An amplifier 222 is coupled to receive the differential sequential signal 220a, 220b from the time division multiplex module 220 and is configured to generate a differential amplified signal 222a, 222b.

A modulator 226 is coupled to receive the differential amplified signal 222a, 222b and to generate a differential modulated signal 224a, 224b. The modulator 226 is operable to do another frequency conversion, i.e., to shift a frequency of the magnetically responsive signal portion back to baseband, and to shift the offset signal portion up to higher frequency in accordance with the chopping frequency, Fchop. It should be appreciated that, the modulator 226 also operates to shift an unwanted offset generated by the amplifier 222 up to the higher frequency. Thus, the differential modulated signal 226a, 226b generated by the modulator 226 has unwanted offset signal portions shifted to a higher frequency and the magnetically responsive signal portion, which is desired, is at baseband.

The differential modulated signal 226a, 226b generated by the modulator 226 can be received by a filter, here, a switched capacitor filter 228, which is an analog sampled filter. In some embodiments the switched capacitor filter 228 is a switched capacitor notch filter, which has a transfer function with a first notch at the chopping frequency, Fchop. The filter 228 essentially removes the unwanted offset signal portion that occurs in the differential modulated signal 226a, 226b at the frequency, Fchop.

An exemplary switched capacitor notch filter is described in U.S. Pat. No. 7,990,209, issued Aug. 2, 2011, entitled "SWITCHED CAPACITOR NOTCH FILTER," which is assigned to the assignee of the present invention and incorporated by reference herein in its entirety.

The switched capacitor filter 228 is configured to generate a filtered signal 228a, which is received by a comparator 230, referred to herein as an omni comparator for reasons that will be apparent from discussion below. The omni comparator 230 is described more fully below in conjunction with FIG. 4.

From discussion above, in accordance with a sampling clock signal, Sclk, received by the time division multiplex module 220, it will be apparent that the filtered signal 228a provided by the switched capacitor filter 228 is, at some sequential times, representative of a signal generated by the planar Hall element 202, at some other sequential times representative of a signal generated by the first vertical Hall element 204, and at some other sequential times representative of a signal generated by the second vertical Hall element 206.

The omni comparator 230 is coupled to receive threshold signals 240a, 240b from a digital to analog converter 240. In some embodiments, the threshold signals 240a, 204b can be the same for each one of the sequential signals described above and provided by the switched capacitor filter 228, or different thresholds can be provided for each one of the sequential signals described above and provided by the switched capacitor filter 228.

The comparator 230 is configured to generate a comparison signal received by an inverter 231, which generates an inverted comparison signal 231a received by registers 232.

The registers 232 are also coupled to receive the sample clock signal, Sclk. The registers are operable, by way of decoding the sample clock signal, Sclk, to sequentially store comparison values (e.g., zero or one) corresponding to the comparisons of the sequential signals 228a provided by the switch capacitor filter 228 with appropriate thresholds 240a, 240b. Thus, in some embodiments, a comparison value can be stored in a register 232a that is representative of a sensed magnetic field in an x direction being above a threshold signal, another comparison value can be stored in a register 232b that is representative of the sensed magnetic field in a y direction being above a threshold signal, and another comparison value can be stored in a register 232c that is representative of the sensed magnetic field in a z direction being above a threshold signal. As described above the threshold signals 240a, 240b can be the same or they can be different for each one of the Hall elements.

As is described in conjunction with FIG. 4 below, the omni comparator 230 uses the threshold signals 240a, 240b to result in two bidirectional operating point thresholds and two bidirectional release point thresholds. Thus, a first state of the comparison values (e.g., one or high state) can be representative of a sensed magnetic field being greater than a corresponding operating point threshold in one of two parallel directions (e.g., along the x, y, or z axes of FIG. 1) represented by the sample signal 228a. A second different state of the comparison values (e.g., zero or low state) can be representative of the sensed magnetic field being below a corresponding release point threshold in one of the two parallel directions. The thresholds are further described below in conjunction with FIG. 6.

The registers 232 provide output values 232aa, 232ba, 232ca. A logic gate 234 is coupled to receive the output values 232aa, 232ba, 232ca. If any one of the output values 232aa, 232ba, 232ca is indicative of a magnetic field being above an associated operating point threshold in a direction of a corresponding coordinate axis, an output signal 234a changes state.

A select output gate 236 can be coupled to receive the output values 232aa, 232ba, 232ca and also coupled to receive the output signal 234a. By way of a select control signal provided from outside of the magnetic field sensor 200 by a user, the select output gate 236 can provide as an output signal either the output signal 234a, all of the output values 232aa, 232ba, 232ca, or any one or more of the output values 232aa, 232ba, 232ca.

The magnetic field sensor can include one or more of a sensitivity adjust memory 216, a detection threshold memory 238, and an offset adjust memory 242, each of which can be programmed with values by a user via a programs signal from outside of the magnetic field sensor 200. The memories can be non-volatile memories.

The sensitivity adjust memory 216 can provide sequential sensitivity values 216a that can take on three different values determined in accordance with the sample clock signal, Sclk. Thus, the sensitivity adjust memory can provide a sensitivity value 216a that is appropriate for which Hall element is presently powered up in a sequential fashion. A digital-to-analog converter 218 can be coupled to receive the sequential sensitivity values 216a and can provide sequential sensitivity signal 218a.

The power chopping switches 208 can be coupled to receive a signal from a current source 219 as a drive signal. The drive signal can be adjusted to three different values depending upon the three different values of the sequential sensitivity signal 218a. In this way, the planar Hall element 202, the first vertical Hall element 204, and the second vertical Hall element 206 can each be driven with different amounts of drive signal to achieve either different sensitivities to a magnetic field, or preferably, the same sensitivities to the magnetic field.

In an alternate embodiment, the sensitivities of the three Hall elements are instead adjusted by way of sequential sensitivity values 216b coupled to a digital-to-analog converter 224, which sequentially adjusts a gain of the amplifier 222.

The detection threshold memory 238 can be used to store three thresholds (e.g., three symmetrical sets of two thresholds) that can be used to compare with each one of the three sequential signals within the output signal 228a from the switched capacitor filter 228. The three stored threshold can be the same or they can be different. Function of the magnetic field sensor 200 when the thresholds are the same and when the thresholds are different are described below in conjunction with FIG. 6.

The offset adjust memory 242 can be used to store three offset correction values that can be sequentially applied to the omni comparator 230 (or, in other embodiments, to the amplifier 222) in accordance with the three sequential signals within the output signal 228a from the switched capacitor filter 228. It will be recognized that, while chopping is described in conjunction with the magnetic field sensor 200, still some residual DC offset may exist and the offset correction values applied through a digital-to-analog converter 244 to the omni comparator 230 can be used compensate for the residual offsets.

The magnetic field sensor 200 can include a micropower regulator 248 coupled to receive the magnetic field sensor power supply voltage, Vcc, and configured to generate a first regulated voltage, Vreg1, which can continuously power an oscillator 250, a power clock generator 252. The micropower regulator 248, the oscillator 250, the power clock generator 252, the output registers 232, the logic gate 234, and the select output gate 236 can remain powered up by Vreg1 at all times during operation of the magnetic field sensor 200. The oscillator 250 can generate a continuous clock signal 250a, and the power clock generator 252 can generate a continuous power clock signal, Pclk. The various clock signals are described more fully below in conjunction with FIG. 3.

The power clock generator is configured to generate a power clock signal, Pclk received by a second voltage regulator 254 configured to generate a second regulated voltage, Vreg2, which turns on and off in accordance with states of the power clock signal, Pclk. The second regulator voltage, Vreg2, is used to power all portions of the magnetic field sensor except for the oscillator 250, the power clock generator 252, the output registers 232, the logic gate 234 and the select output gate 236. Thus, in operation, substantial portions of the magnetic field sensor 200 power on and off (or to a low power state) at a cycle rate and a duty cycle determined by the power clock signal, Pclk. Essentially, the magnetic field sensor powers up from time to time, senses a magnetic field in the environment, determines if the magnetic field is above operating point thresholds stores such information into the registers 232 and makes available an indication of same at all times. As a result, micropower operation is achieved.

The magnetic field sensor 200 can also include a sample clock module 256 coupled to receive the clock signal 250a and the chopping clock module 258 also coupled to receive the clock signal 250a. The sample clock module 256 and the chopping clock module 258 can also be coupled to receive the power clock signal, Pclk. The sample clock module 256 is configured to generate the sample clock, Sclk. The chopping clock module 258 is configured to generate the chopping clock with a frequency, Fchop.

Figure 3:
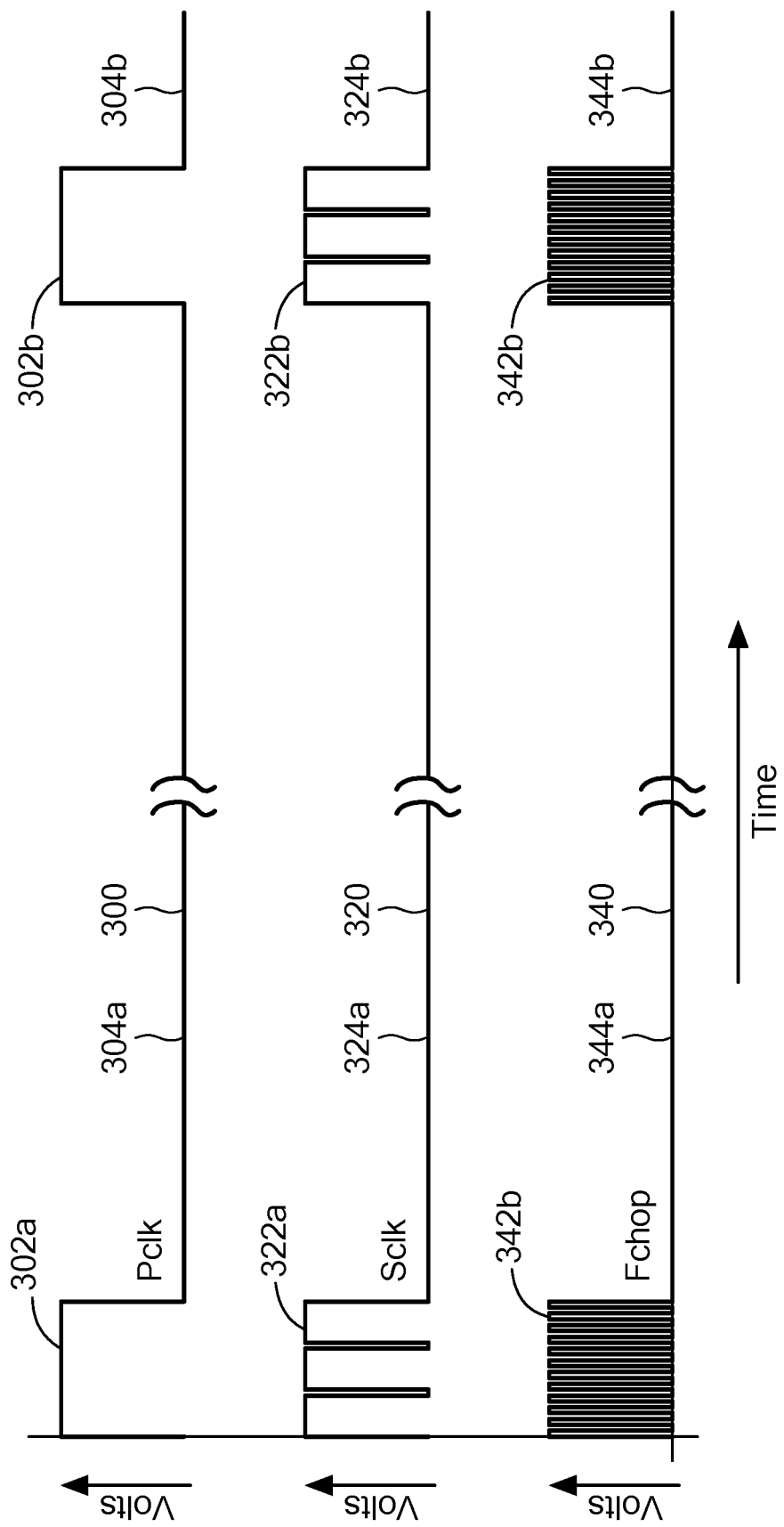
FIG. 3 is a graph showing three exemplary clock signals that can be used within the magnetic field sensor of FIG. 2.

Referring now to FIG. 3, a signal 300 is representative of the power clock signal, Pclk, of FIG. 2. The power clock signal 300 can have sequential high states 302a, 302b with time durations of Thigh, between which are low states 304a, 304b with time durations of Tlow. From discussion above in conjunction with FIG. 2, it will be appreciated that the majority of the circuits within the magnetic field sensor 200 are powered on during high states of the power clock signal, Pclk, and powered off during the low states of the power clock signal, Pclk. However, it should be recognized that the shorter time duration states can instead be low states and the longer time duration state can instead be a high state without departing from the invention.

In order to achieve micropower operation, in some embodiments, Thigh/(Thigh+Tlow) is less than or equal to 0.001, i.e., the power on duty cycle is less than 0.1 percent. However, in other embodiments, the duty cycle can be in a range of ten percent to 0.001 percent, or any duty cycle less than about ten percent.

In some embodiments, a sample time period, Thigh+Tlow, is about fifty milliseconds. Thus, the three Hall elements of FIG. 2 must be sampled in a time period of about fifty microseconds. However, other sample time periods are also possible in a range of about ten seconds to about ten milliseconds.

The above sample time period of fifty milliseconds is selected in accordance with a bandwidth of a sensed magnetic field. By Nyquist, 1/(sample time period) must be greater than two times the bandwidth of the signal to be sampled. Thus, if the sample time period is fifty milliseconds, the maximum bandwidth of the signal to be sample is ten Hz.

While the above represents a narrow detected bandwidth, the bandwidth of the electronic circuits of the magnetic fields sensor 200 of FIG. 2 must be substantially greater than ten Hz in order to pass the short time duration samples of the three Hall Effect elements. It is known that wider bandwidth results in larger amounts of thermal noise. The thermal noise manifests itself as an apparent shift in the trip points at the omni comparator 230. Thus, in some embodiments, the threshold values stored in the detection threshold memory 238 are adjusted to account for the thermal noise resulting from the wide bandwidth.

A signal 320 is representative of the sample clock signal, Sclk, of FIG. 2. Within each high state of the signal 300, the signal 320 has three high states and two low states 322a, 322b. Each high state of the signal 320 corresponds to one sample of one of the Hall elements in the magnetic field sensor 200 of FIG. 2. Thus, during a first high state, one of the three Hall elements is sampled and sent through the electronic channel of the magnetic field sensor 200, during a second high state another one of the three Hall elements is sampled and sent through the electronic channel, and during a third high state another one of the three Hall elements is sampled and sent through the electronic channel.

It should be appreciated that the various modules of the magnetic field sensor 200 of FIG. 2 that receive the sample clock signal, Sclk, must decode the sample clock signal. However, in other embodiments, the sample clock signal, Sclk, can be provided as three separate signals, each having one of the high states in sequence.

A signal 340 is representative of the chopping clock signal with the frequency, Fchop of FIG. 2. For four state chopping, there are four or more clock pulses in the signal 340 for each one of the high states 322a of the sample clock signal 320. At other times, the chopping clock signal is inactive, or low.

It will be appreciated that all of the sampling of the Hall elements of FIG. 2, and all of the chopping of the Hall elements, occurs during the high or active state of the power clock signal, Pclk, 300. At other times, most of the magnetic field sensor 200 is powered off.

Figure 4:
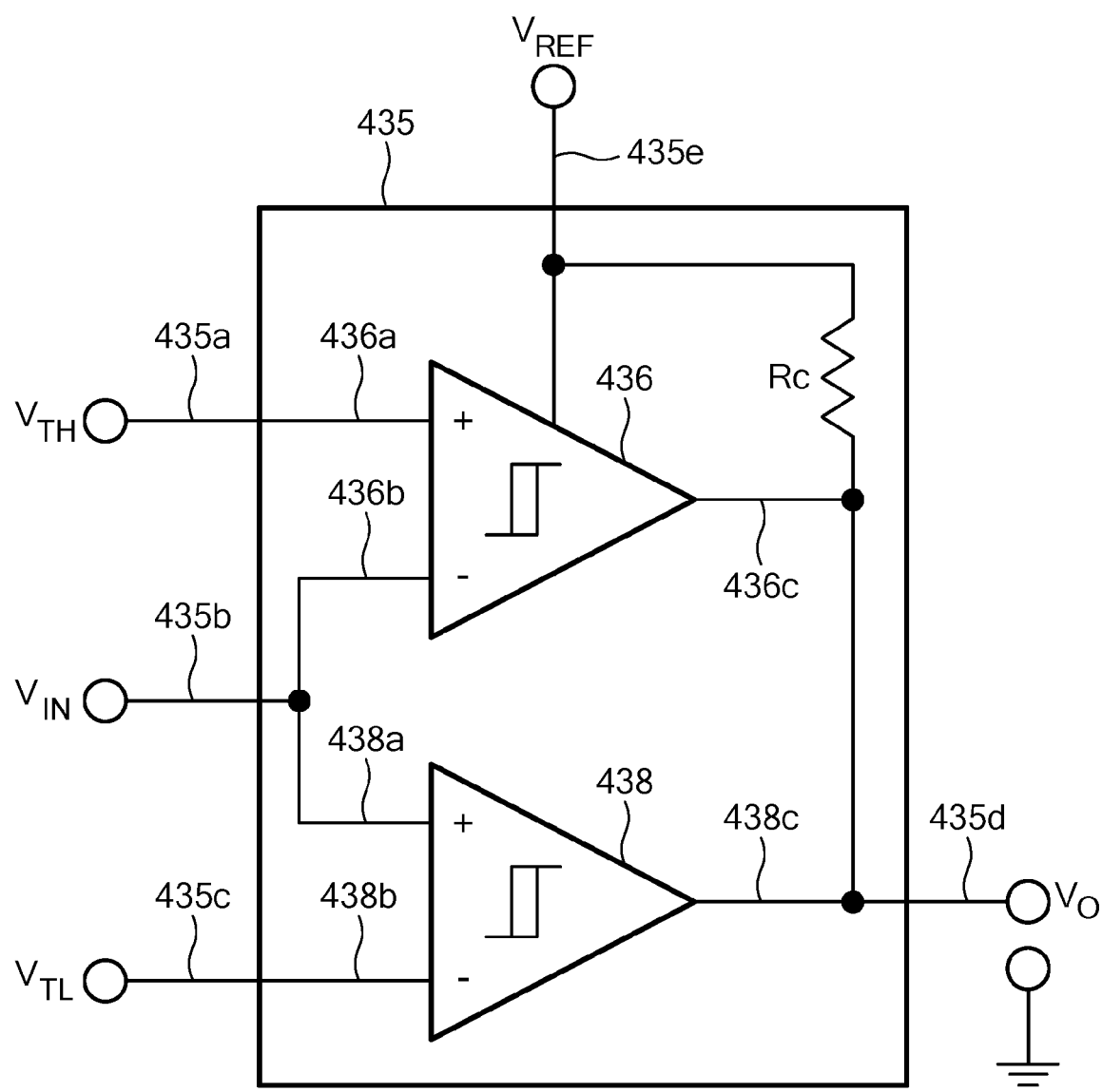
FIG. 4 is a block diagram of an exemplary omni comparator that can be used as the omni comparator of FIG. 2.
Figure 5:
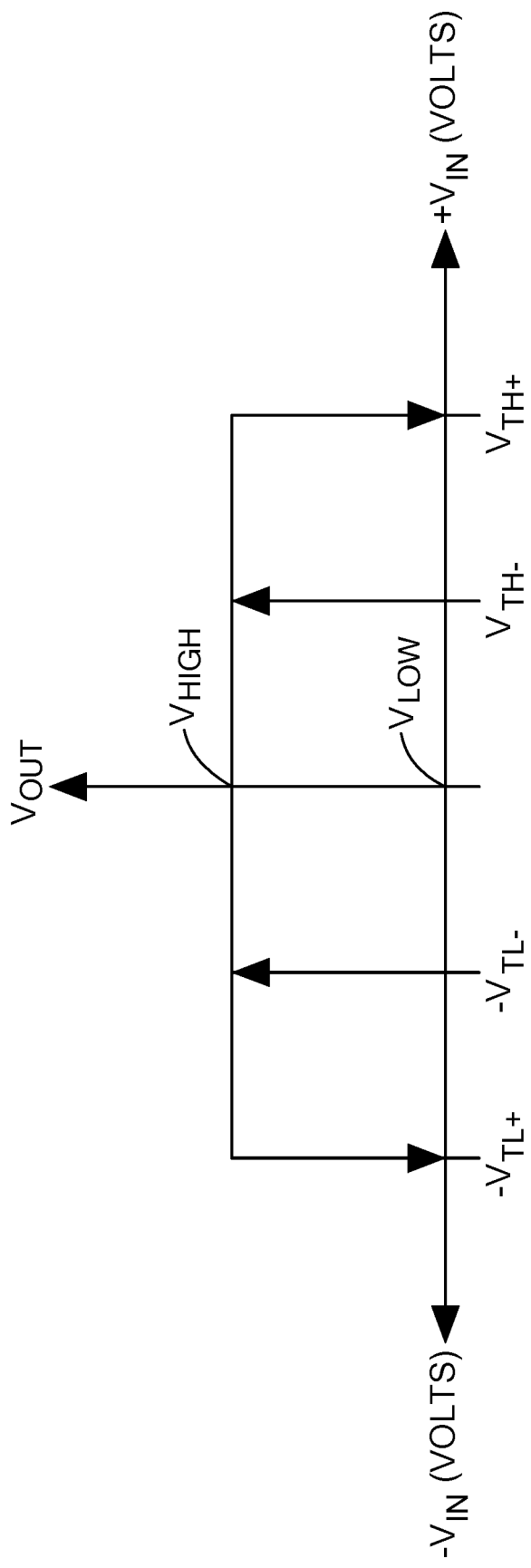
FIG. 5 is a block diagram of an exemplary transfer function that describes function of the omni comparator of FIG. 4.

Referring now to FIGS. 4 and 5, a comparator circuit 435 can be the same as or similar to the omni comparator 230 of FIG. 2. The comparator circuit 435 has a plurality of terminals, 435a-435e, and includes first and second and comparators 436, 438. The comparator 436 has a first terminal 436a coupled to a first reference voltage $V_{TH}$ at terminal 435a, a second input terminal 436b coupled to an input voltage $V_{IN}$ at terminal 435b and an output terminal 436c coupled to comparator circuit output terminal 435d where an output voltage $V_{OUT}$ is provided. A reference voltage, $V_{REF}$ is coupled to terminal 435e and provides a reference voltage to comparators 436, 438.

Reference is made below to threshold voltages $V_{TH+}$, $V_{TH-}$, $V_{TL+}$, $V_{TL-}$. It will be recognized that the threshold voltages $V_{TH+}$ and $V_{TL+}$ are representative of the above-described operating point thresholds (i.e., threshold signals 240a, 240b of FIG. 2) and the threshold voltages $V_{TH-}$ and $V_{TL-}$ are representative of the above-described release point thresholds, which are a result of hysteresis within the comparator circuit 435.

The comparator 438 includes a first input terminal 438a coupled at input port 435b to the input voltage $V_{IN}$ and a second input terminal, 438b, coupled to a threshold voltage $V_{TL}$ at terminal 435c. An output terminal 438c of comparator 438 is coupled to provide the output voltage $V_{OUT}$ at the output terminal 435d.

In this particular embodiment, comparators 436, 438 are provided having a means for including hysteresis such that the reference or threshold voltages $V_{TH}$, $V_{TL}$ can be represented as $V_{TH+}$ and $V_{TH-}$ and $V_{TL+}$ and $V_{TL-}$, respectively. The values $V_{TH+}$, $V_{TH-}$, $V_{TL+}$, $V_{TL-}$ represent the comparator switch points depending upon the value of the output voltage $V_{OUT}$. In operation, and as seen in FIG. 5, once the output voltage $V_{OUT}$ switches (e.g. from a high level to a low level), then the switch point changes from $V_{TH+}$ to $V_{TH-}$. Likewise, once the output voltage $V_{OUT}$ switches from a low level to a high level, then the switch point changes from $V_{TH-}$ to $V_{TH+}$.

As can be seen in FIG. 5, the same holds true as the input voltage $V_{IN}$ assumes negative voltages (i.e., voltage values on the left hand side of the Vout-axis in FIG. 5). That is, once the output voltage $V_{OUT}$ switches then the switch point changes from $-V_{TL+}$ to $-V_{TL-}$ and vice-versa depending upon whether the output is switching from low to high or from high to low.

If the output voltage $V_{OUT}$ is high and the input voltage $V_{IN}$ has a value greater than or equal to zero, when the input voltage $V_{IN}$ meets or exceeds the voltage $V_{TH+}$, the output voltage switches from a value of $V_{HIGH}$ to $V_{LOW}$ and the switch point changes from $V_{TH+}$ to $V_{TH-}$. Thus the value of the output voltage $V_{OUT}$ will not switch from $V_{LOW}$ to $V_{HIGH}$ until the input voltage $V_{IN}$ reaches the value $V_{TH-}$.

It should be appreciated that, in other embodiments and applications, it may be preferable to utilize comparators which do not have hysteresis and thus switching occurs at a single voltage level, e.g., $V_{TH+}$ and $-V_{TL+}$, i.e., only operating point thresholds are used.

With reference to only one of the Hall elements of FIG. 2, and to one corresponding directional axis of FIG. 1, in operation, and with reference now to FIG. 5, the input voltage $V_{IN}$ is generated in response to a magnetic field being provided to and removed from a magnetic field sensing device which senses the magnetic field and provides a corresponding signal in response thereto.

Assuming the input voltage $V_{IN}$ is at or near zero volts (i.e. $V_{IN}$=0 volts), the output voltage $V_{OUT}$ is at a first predetermined voltage level $V_{HIGH}$. In response to a magnetic field, the Hall element (e.g., 202, 204, 206 of FIG. 1) that causes the input voltage provides either a positive or a negative input voltage $V_{IN}$. If the input voltage provided by the Hall element moves in a positive direction from zero volts toward the threshold voltage, $V_{TH+}$, when the threshold voltage meets and/or exceeds the threshold voltage level $V_{TH+}$, then the output voltage $V_{OUT}$ changes from the predetermined signal level, $V_{HIGH}$ to a second predetermined voltage level $V_{LOW}$. When the input voltage moves past the threshold voltage $V_{TH-}$ in a negative-going direction, the output voltage changes from $V_{LOW}$ back to $V_{HIGH}$.

Likewise, as the input voltage moves in a negative direction from zero volts and reaches and/or exceeds the threshold voltage $-V_{TL+}$, the output voltage $V_{OUT}$ changes from the first value $V_{HIGH}$ to the second value $V_{LOW}$. Similarly, as the input voltage $V_{IN}$ moves from $-V_{TL+}$ and reaches and/or exceeds the voltage level $-V_{TL-}$, the voltage level then changes from the output voltage level $V_{LOW}$ to $V_{HIGH}$.

While the graph of FIG. 5 is representative of a particular polarity of output signal from the comparator circuit 435, it should be recognized that a similar circuit can generate the opposite polarity.

Figure 6:
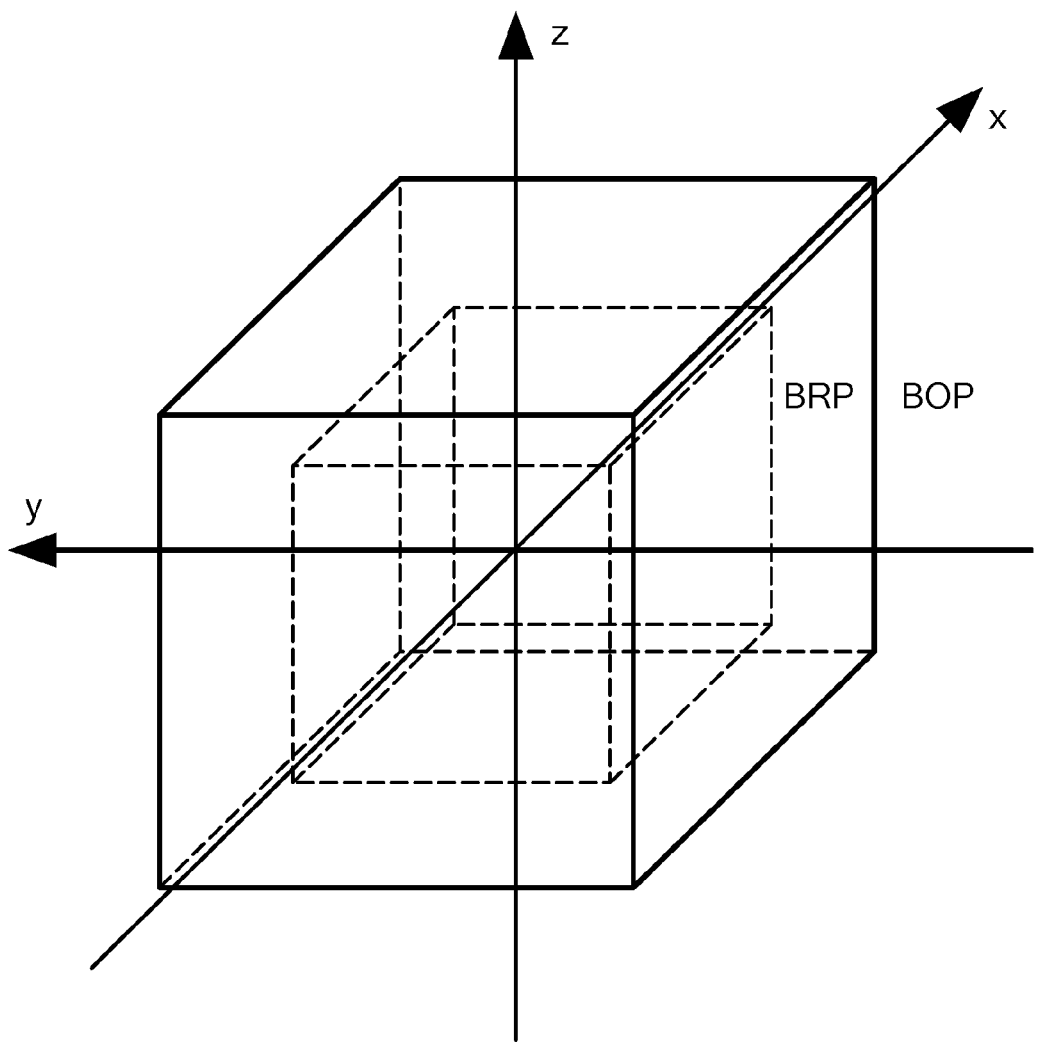
FIG. 6 is a pictorial showing three-dimensional operating point thresholds (BOP) and three-dimensional release point thresholds (BRP)

Referring now to FIG. 6, a graph has x, y, and z axes representative of the same axes in FIG. 1. The axes are each indicative of magnetic field strengths. An outer box is representative of the operating point thresholds (BOP) in three dimensions corresponding to the three dimensions of the Hall elements 202, 204, 206 of FIG. 2. An inner box is representative of the release point thresholds (BRP) in three dimensions corresponding to the three dimensions of the Hall elements.

In operation of the magnetic field sensor 200 of FIG. 2, it should be understood that a magnetic field experienced by the magnetic field sensor 200 having any of its Cartesian coordinates on the reference axes described in FIG. 1 is greater in absolute value than the operating point thresholds, i.e., outside of the outer box, results in a change of state of the output signal 234*a* of the magnetic field sensor 200 to a first state indicative of a detection of the magnetic field. It should also be recognized that a magnetic field experienced by the magnetic field sensor 200 having any of its Cartesian coordinates on the reference axes described in FIG. 1 lower in absolute value than the release point thresholds, i.e., inside of the inner box, results in a change of state of the output signal 234*a* of the magnetic field sensor 200 to a second different state indicative of a lack of detection of the magnetic field.

In view of the above, the magnetic field sensor 200 operates as a three-dimensional switch operable to detect a magnetic field that can be pointing in any direction with a magnitude that is beyond the outer box.

While square boxes are shown, any one of more dimensions of the two boxes can be reshaped (i.e., to a shape other than a cube) by changing threshold values stored in the detection threshold memory 238 of FIG. 2.

Figure 7:
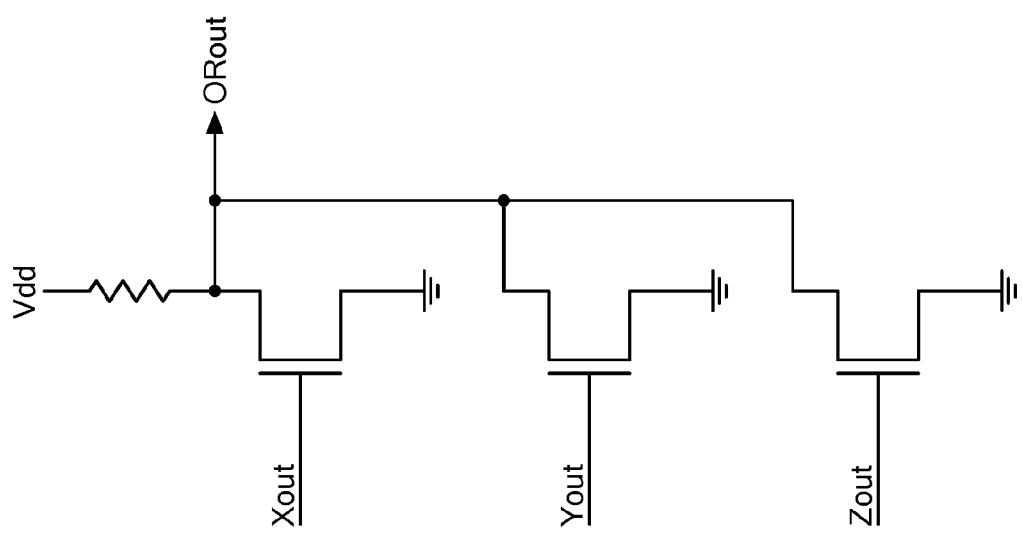
FIG. 7 is a block diagram showing a wired or gate structure that can be used in conjunction with the magnetic field sensor of FIG. 2.
Figure 8A:
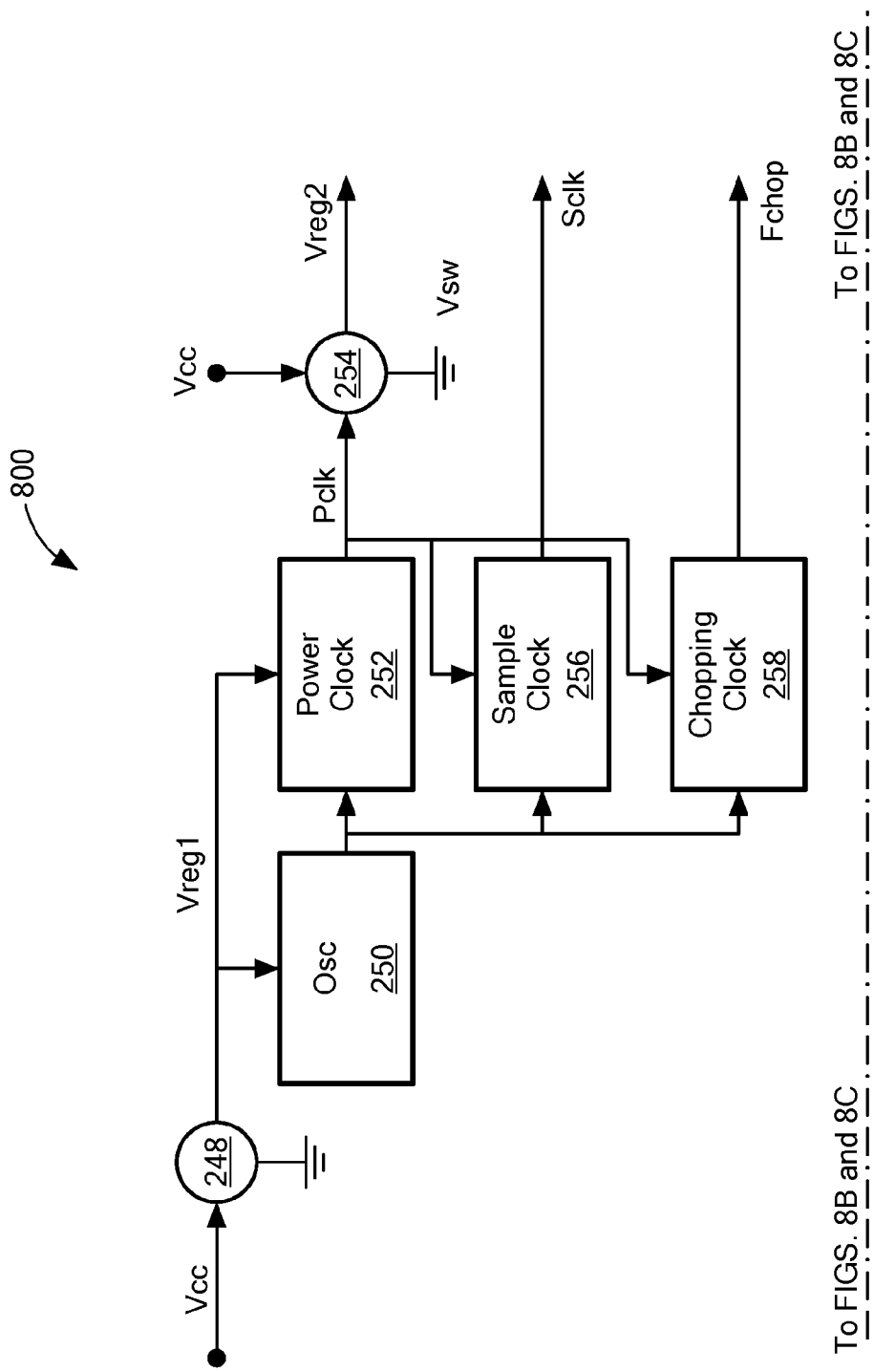
Figure 8B:
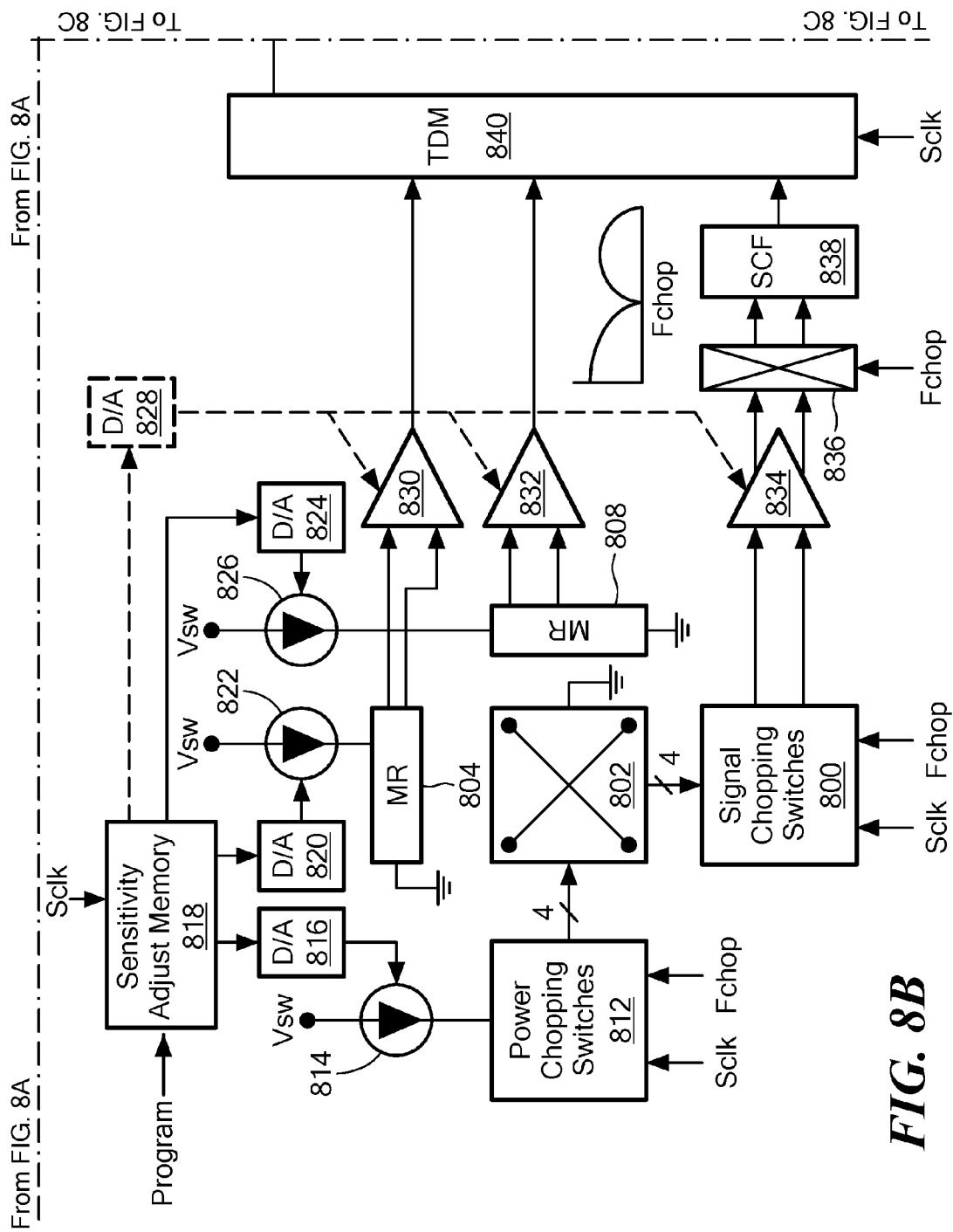
Figure 8C:
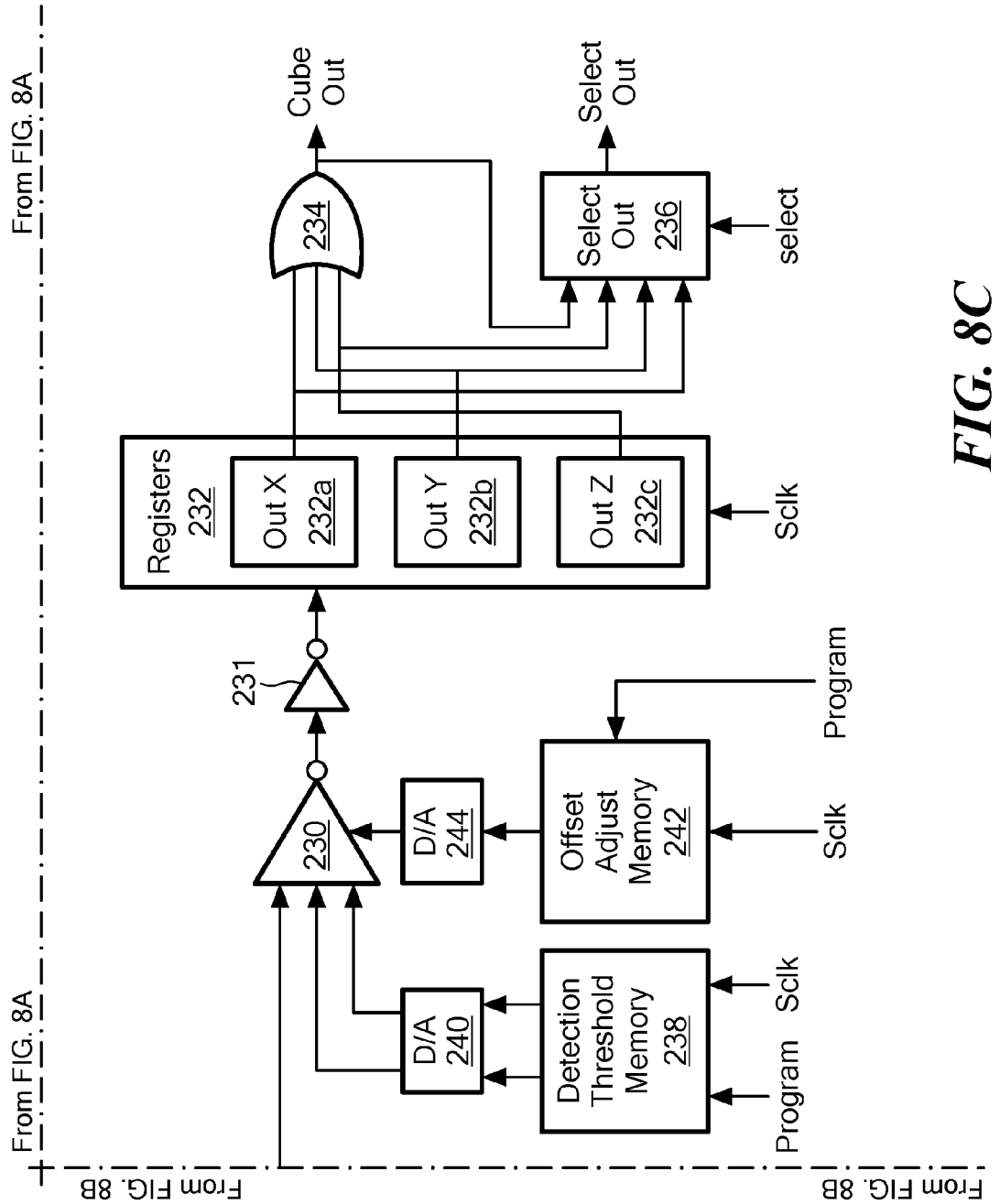

Referring now to FIG. 7, for embodiments in which the output signals 232*aa*, 232*ba*, 232*ca* are provided as output signals by way of the selection output module 236 of FIG. 2, a wired OR function can be brought provided by three FETS, or otherwise, by three transistors, each coupled to a pull-up resistor terminating in a user selectable power supply voltage, Vdd.

An output signal ORout from the wired OR circuit can behave very much like the output signal 234*a* of FIG. 2, but for which high states are determined by the power supply voltage, Vdd.

Figure 8:
FIG. 8, which includes FIGS. 8A, 8B, and 8C in combination, is a block diagram of another exemplary magnetic field sensor, in the form of a magnetic switch, which can be used as the magnetic field sensor of FIG. 1, and which has a planar Hall element and two magnetoresistance element circuits.

Referring now to FIG. 8, in which like elements of FIG. 2 are shown having like reference designations, an alternate exemplary magnetic field sensor includes a planar Hall element 802. However, in place of the first vertical Hall element 204 and the second vertical Hall element 206, the magnetic field sensor 800 includes a first magnetoresistance circuit 804 and a second magnetoresistance circuit 808. As described above, magnetoresistance elements and circuits tend to have a maximum response axis parallel to a substrate on which they are constructed, in a sense similar to vertical Hall elements.

Magnetoresistance elements and magnetoresistance circuits are not chopped, and thus, the chopping is applied only to the planar Hall element 802.

In order to adjust sensitivities, the magnetic field sensor 800 can include digital-to-analog converters 820, 824 coupled to current sources 822, 826, respectively. The current sources 822, 826 are coupled to drive the magnetoresistance circuits 804, 806, respectively.

The digital-to-analog converters 820, 824 can be coupled to a sensitivity adjust memory 818. The sensitivity just memory 818 can be the same as or similar to the sensitivity adjust memory 216 of FIG. 2. Values stored in the sensitivity adjust memory 818 can adjust sensitivities of the planar Hall element 802, the first magnetoresistance circuit 804, and the second magnetoresistance circuit 808 by way of magnitudes of drive signals provided by the current sources 814, 822, 826, respectively.

Amplifiers 834, 830, 832 are coupled to the planar Hall element 802, the magnetoresistance circuit 804, and the magnetoresistance circuit 808, respectively. In an alternate embodiment, the sensitivity adjust memory 818 can provide sensitivity adjust values to a digital-to-analog converter 828, which can sequentially adjust gains of the amplifiers 834, 830, 832, resulting in a sensitivity adjustment of the magnetic field sensing elements.

A chopping modulator 836 can be the same as or similar to the chopping modulator 226 of FIG. 2. A switched capacitor notch filter 838 can be the same as or similar to the switched capacitor notch filter 228 of FIG. 2.

A time division multiplexing module 840 can be coupled to receive signals from the amplifiers 830, 832 and from the switched capacitor notch filter 838. In operation, by way of a sample clock signal, Sclk, which can be the same as or similar to the sample clock signals of FIGS. 2 and 3, the time division multiplexing module 840 can sequentially select from among the input signals to provide a sequential output signal to the omni comparator 230, which can be the same as or similar to the omni comparator 230 of FIG. 2 and the comparator circuit 435 of FIG. 4.

Other portions of the magnetic field sensor 800 can be the same as or similar to portions of the magnetic field sensor 200 of FIG. 2. However, a chopping clock signal generated by a chopping clock module 868 at the frequency Fchop can be different than the signal 340 of FIG. 3. In particular, for four phase chopping, the signal 340 includes a minimum of twelve chopping pulses, for a minimum of four pulses for each one of three Hall elements in the magnetic field sensor 200 of FIG. 2. In contrast, the magnetic field sensor 800 has only one Hall element, and therefore, a minimum of four chopping clock pulses are needed for four phase chopping.

While four phase chopping as described herein, it will be recognized that chopping can use more than four phases or fewer than four phases, in which case the chopping clocks can have more than the number of pulses shown or fewer than the number of pulses shown, accordingly.

Figure 9:
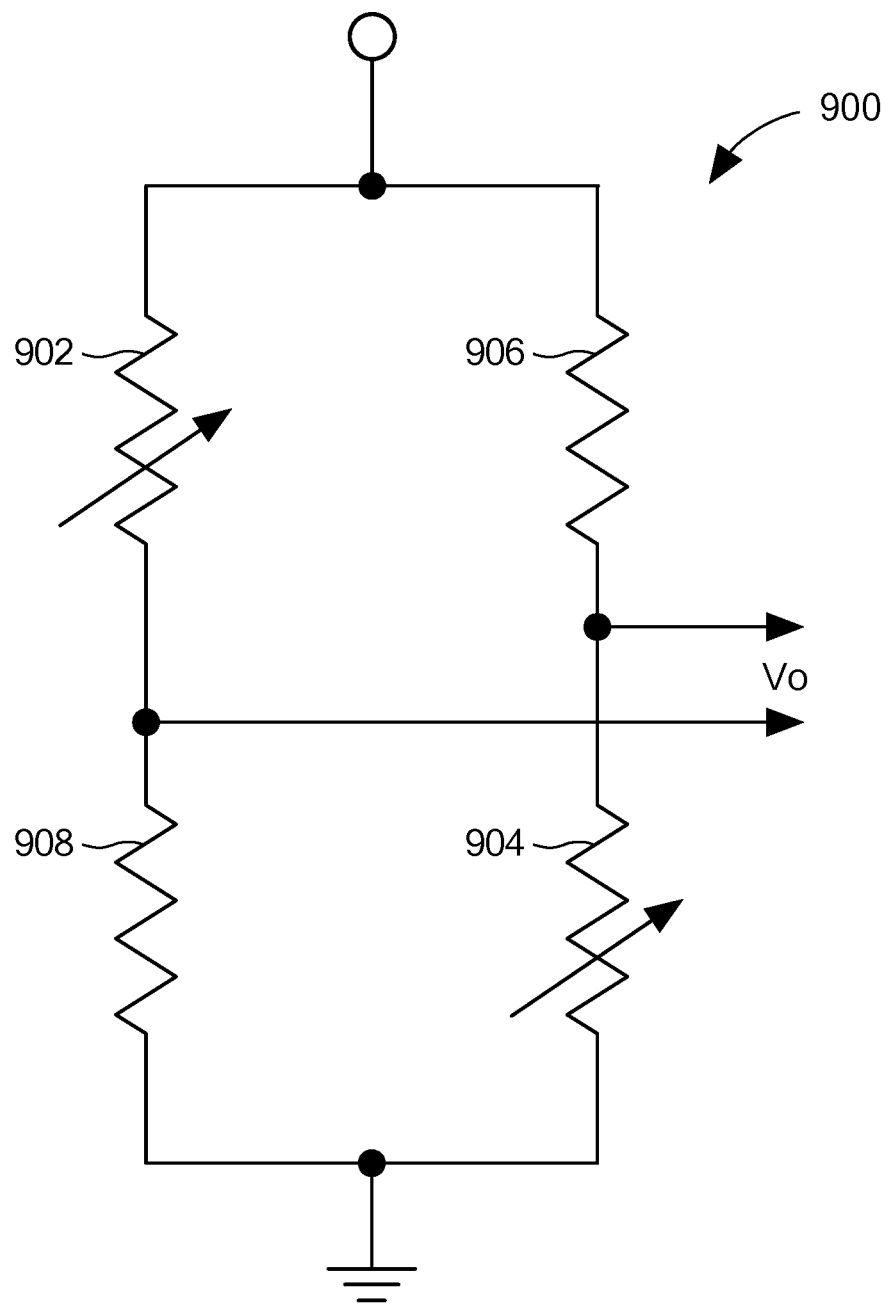
FIG. 9 is a block diagram of an exemplary magnetoresistance element circuit that can be used as the magnetoresistance element circuits of FIG. 8.

Referring now to FIG. 9, an exemplary magnetoresistance circuit 900 is configured in a bridge arrangement having two magnetoresistance elements 902, 904, and two static resistors 906, 908. The magnetoresistance circuit 900 can be the same as or similar to each one of the magnetoresistance circuits 804, 808 of FIG. 8. To achieve the two magnetoresistance circuits 804, 806, which have maximum response axes pointed along different coordinate axes, the magnetoresistance circuit 900 is merely fabricated a two instances on the substrate with the magnetoresistance elements 902, 904 parallel to each other but at different angles on the substrate.

While one particular form of magnetoresistance circuit 900 is shown, there are many forms of magnetoresistance circuits, in the form of the magnetoresistance circuit can depend on the type of magnetoresistance elements used.

Figure 10:
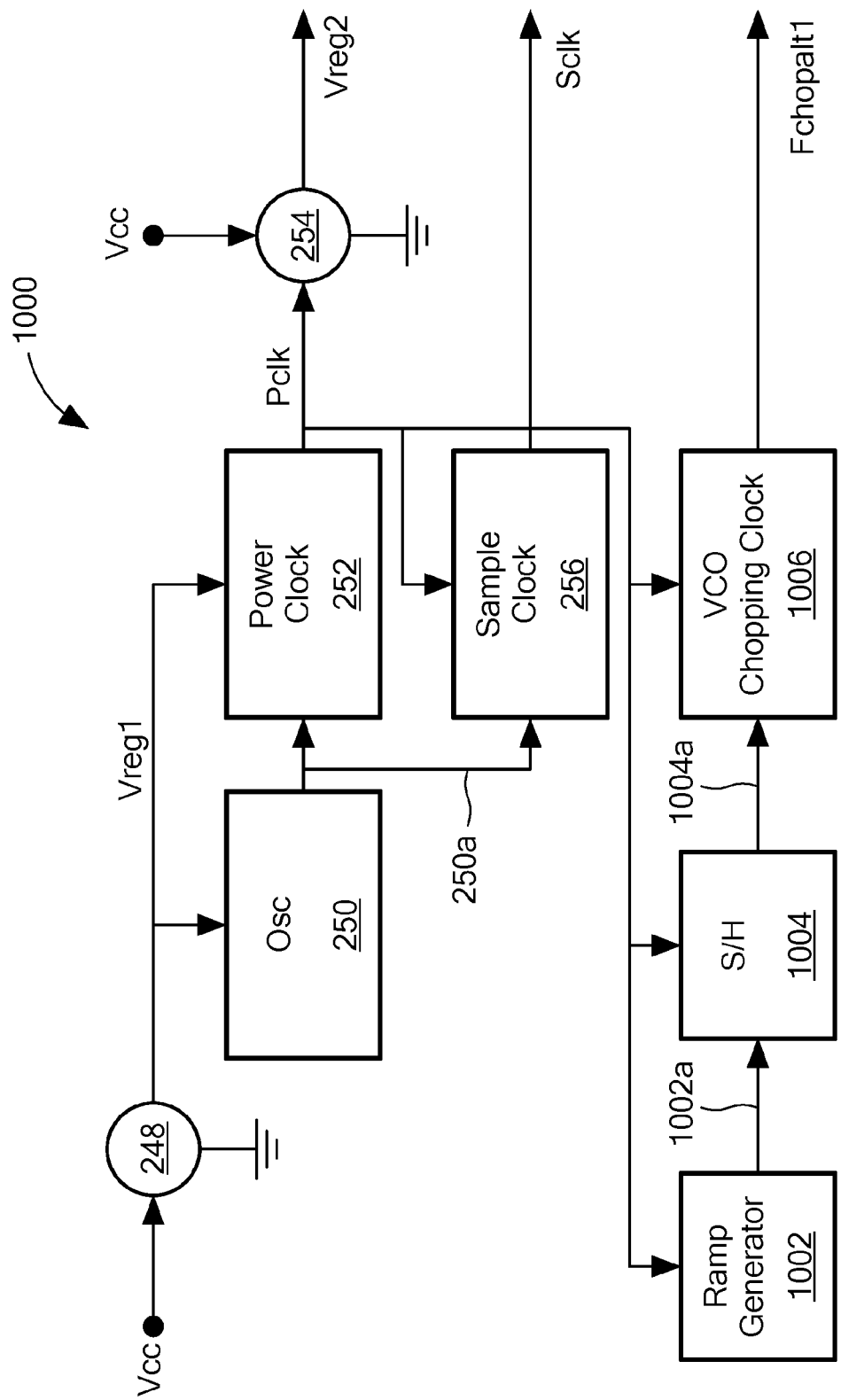
FIG. 10 is a block diagram of an alternate embodiment of power and clocking portions that can be used in the magnetic field sensors of FIGS. 2 and 8.

Referring now to FIG. 10, in which like elements of FIGS. 2 and 8 are shown having like reference designations, an alternate exemplary power and clocking circuit 1000 can be used in place of the power and clocking circuit of FIGS. 2 and 8.

The power and clocking circuit can include a ramp generator 1002 that provides a ramp signal 1002a to a sample and hold module 1004. The sample and hold module 1004 provides a sample and hold signal 1004a, which is a sample and held version of the ramp signal 1002a, to a voltage controlled oscillator (VCO) chopping clock module 1006. The voltage controlled chopping clock module 1006 is configured to generate a chopping clock that has a variable frequency Fchopalt1.

In operation, upon each on state (e.g., high state) of the Pclk signal (e.g., a signal 300 of FIG. 3), the sample and hold module 1004 holds a new value of the ramp signal 1002a generated by the ramp generator. Thus, the sampling held signal 1004a can be a step signal that steps upward (and/or downward) causing frequency Fchopalt1 of the chopping signal to step upward (and/or downward) in frequency during each on state of the Pclk signal.

The upward (and/or downward) steps in frequency can be equal steps or unequal steps.

The varying frequency Fchopalt1 has advantages in rejecting possible noise signals that may occur in the magnetic field sensors 200, 800 of FIGS. 2 and 8.

Benefits of having a chopping frequency that changes are described, for example, in U.S. patent application Ser. No. 12/845,115, file Jul. 28, 2010, and entitled "MAGNETIC FIELD SENSOR WITH IMPROVED DIFFERENTIATION BETWEEN A SENSED MAGNETIC FIELD AND A NOISE SIGNAL," which is assigned to the assignee of the present invention and which is incorporated by reference herein in its entirety.

Figure 11:
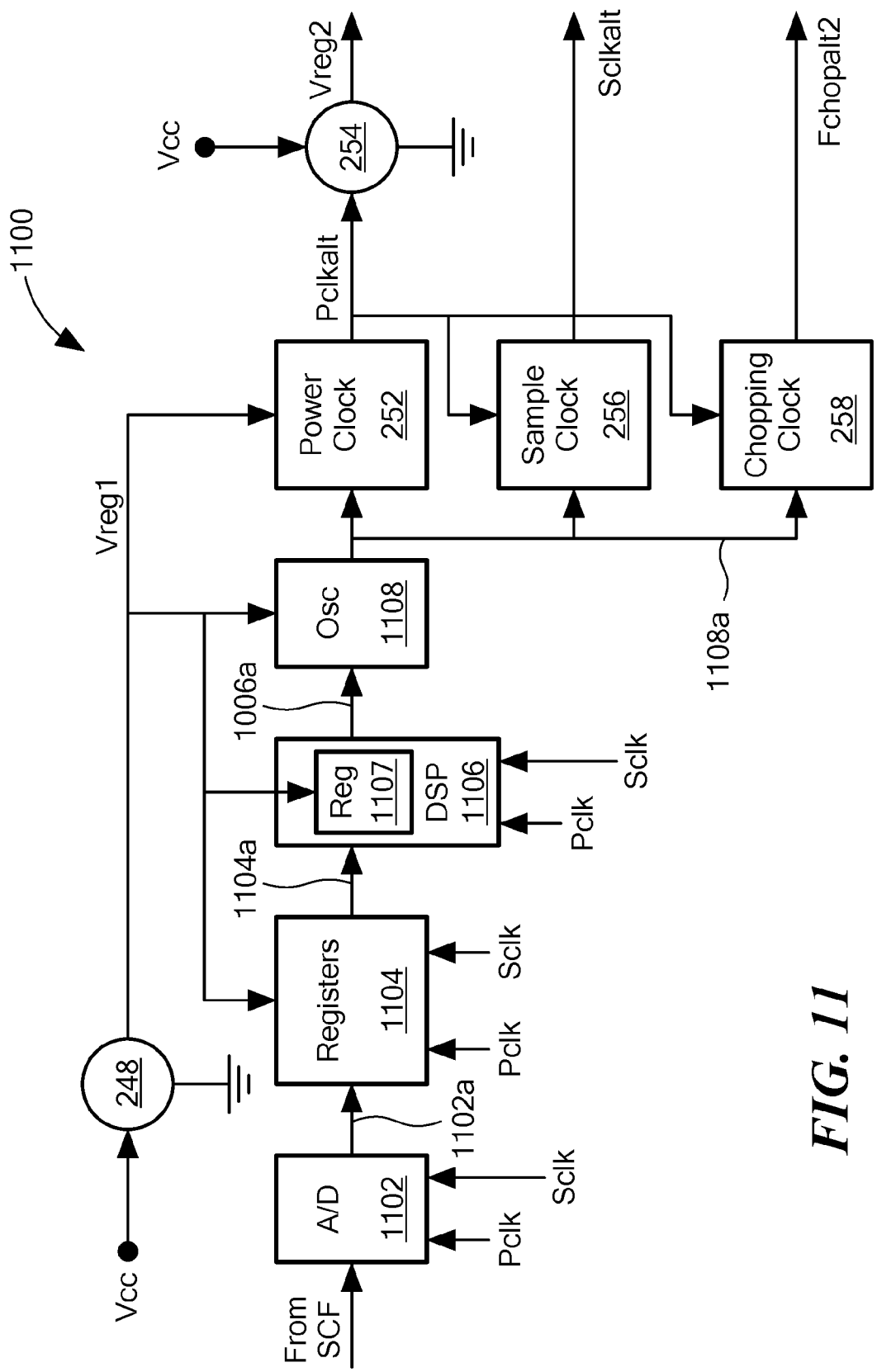
FIG. 11 is a block diagram of another alternate embodiment of power and clocking portions that can be used in the magnetic field sensors of FIGS. 2 and 8.

Referring now to FIG. 11, in which like elements of FIGS. 2 and 8 are shown having like reference designations, another alternate exemplary power and clocking circuit 1100 can be used in place of the power and clocking circuit of FIGS. 2 and 8.

The power and clocking circuit 1100 can include an analog-to-digital converter 1102 coupled to receive the signal 228a from the switched capacitor filter 228 of FIG. 2, or alternatively, from the time division multiplex module 840 of FIG. 8.

The analog-to-digital converter 1102 is configured to generate a digital signal 1102a representative of amplitudes of magnetic field signals generated by the three magnetic field sensing elements of FIGS. 2 and 8, i.e., representative of magnetic fields in the three coordinate axes.

The power clocking circuit 1100 can also include registers 1104 coupled to receive and store the digital signal 1102a from a plurality of samples of the signals from the magnetic field sensing elements, i.e., associated with a plurality of the Pclk high states (see, e.g., a signal 300 of FIG. 3).

A digital signal processor 1106 can be coupled to receive the plurality of values 1104a from the registers 1104. The digital signal processor can include registers 1107 that can provide a control signal 1106a that can speed up or slow down an oscillator 1108.

The registers 1104, the registers 1107, and the oscillator 1108 can remain continually powered on by way of the voltage Vreg1.

In operation, the digital signal processor can determine how fast the magnetic field experienced by the magnetic field sensing elements of FIGS. 2 and 8 is changing. According to the rate of change of magnetic field sensed by the digital signal processor, the digital signal processor can cause the oscillator 1108 to generate a clock signal 1108a that can speed up or slow down depending on the sensed rate of change of the magnetic field. Thus, for a faster rate of change of the sensed magnetic field, the oscillator 1108 can cause the PCLK signal, the Sclk signal, and/or the chopping clock signal, with a frequency Fchopalt2, to run faster. Thus, for a fast rate of change of the sensed magnetic field, sampling of the magnetic field sensing elements of FIGS. 2 and 8 can achieve a faster sampling rate. Conversely, for a slow rate of change of the sensed magnetic field, sampling of the magnetic field sensing elements of FIGS. 2 and 8 can achieve a slower sampling rate, therefore conserving power.

It should be appreciated that the techniques shown and described above in conjunction with FIGS. 10 and 11 can be used separately, or, in alternate embodiments, the two techniques can be used together.

While FIGS. 1 to 11, focus on changes in a magnetic field in one direction in either in the x-, y- or z-axis, measurements may be taken in a combination of two or more axes. For example, a true three-dimensional magnetic vector amplitude sensor is further described herein that measures magnetic field amplitude in more than one axis. The goal of this sensor is to sense the absolute amplitude (called herein "magnitude") of a magnetic vector in space regardless of the polarity or orientation of the magnetic field. In one example, this type sensor increases sensitivity in detecting magnetic tampering in applications such as smart meters, automated teller machines (ATMs), gambling/gaming devices, electronic locks, and so forth. In applications such as tamper detection in smart meters, the apparent sensitivity is reduced when the applied field is off axis, (i.e., not aligned in either in the x-, y-, or z-axis). The techniques further described herein allow the sensor to sense the true vector amplitude of an external magnetic field. In one example, the techniques described herein determine a vector sum of the three components (or some representation/approximation) and outputs a linear representation of the applied field amplitude and/or applies a threshold and delivers a digital indication of the applied field amplitude. In another example, the output is a signal (e.g., a warning signal) indicating that the magnitude of the magnetic field detected exceeds a threshold value.

Figure 12:
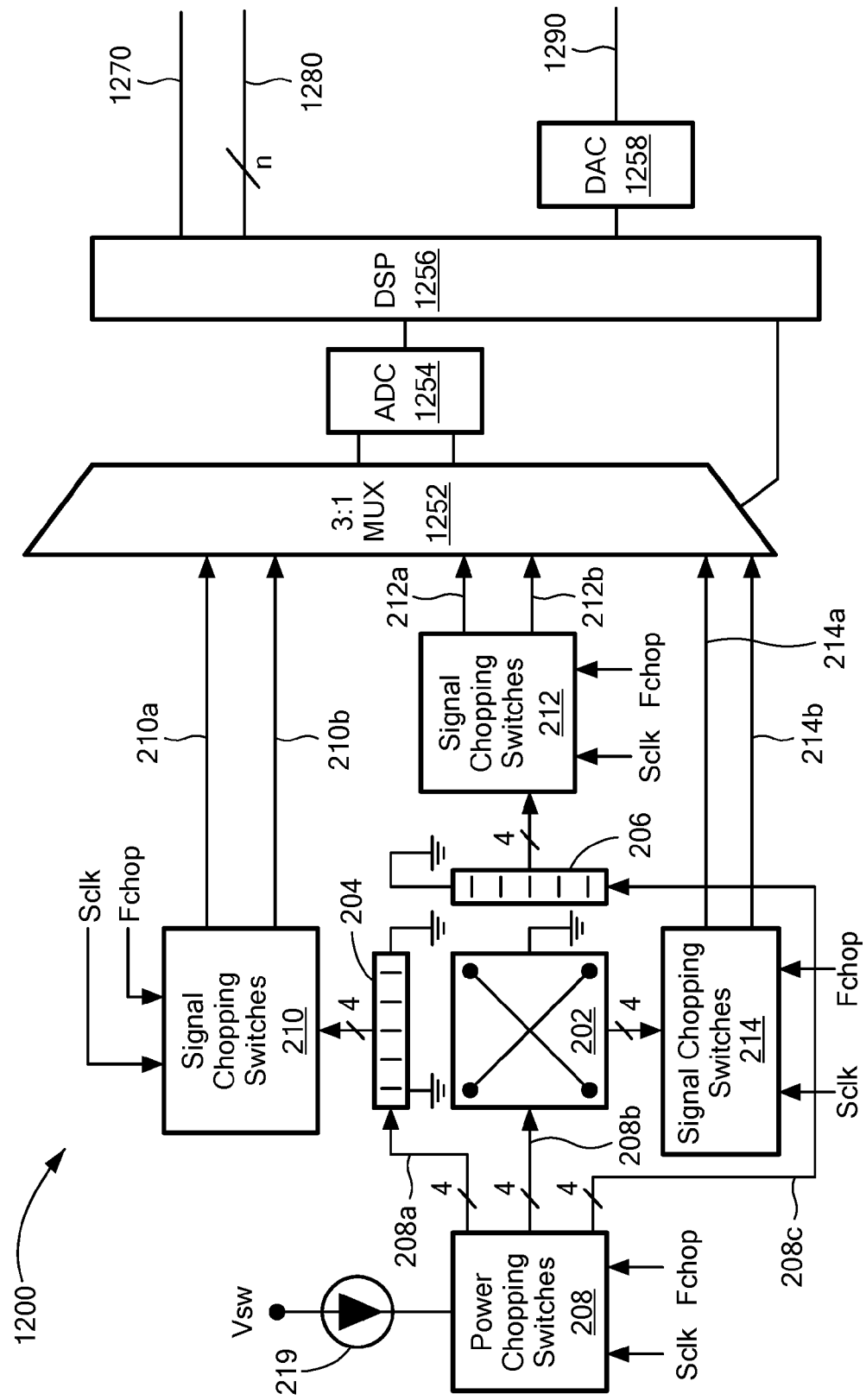
FIG. 12 is a block diagram of another example of a magnetic field sensor, in the form of a magnetic switch, which can be used as the magnetic field sensor of FIG. 1, which has a planar Hall element and two vertical Hall elements.

Referring to FIG. 12, a sensor 1200 includes some of the features of FIG. 2, except the sensor 1200 includes a multiplexor 1252 (e.g., 3:1 mux), which includes the functionality of a TDM (e.g., TDM 220) and a chopper. In particular, the multiplexor 1252 receives the three sets of differential signals from the respective Hall elements 202, 204, 206 (e.g., receiving differential signals 210a, 210b, the differential signals 212a, 212b and the differential signals 214a, 214b). The differential signals 210a, 210b in the x-axis are converted to a digital signal by the ADC (analog-to-digital converter) 1254, differential signals 212a, 212b in the y-axis are converted to a digital signal by the ADC 1254 and differential signals 214a, 214b in the z-axis are converted to a digital signal by the ADC 1254.

The DSP (digital signal processor) 1256 provides binary signals 1270 and 1280. In one example, the binary signal 1270 is a warning signal that indicates (e.g., a "1") if the magnitude of the vector sum ($\sqrt{B_x^2+B_y^2+B_z^2}$) is greater than a threshold hold value corresponding to a particular magnetic field magnitude. In one example, the threshold value may be adjustable (e.g., by a user).

In one example, the binary signals 1280 may be transmitted using an n bit (n>0) signal that indicates the value of the vector sum ($\sqrt{B_x^2+B_y^2+B_z^2}$) in binary form.

The DSP 1256 may also output a signal to a DAC (digital-to-analog converter) 1258 and the DAC 1258 outputs a signal 1290, which is an analog signal indicating the value of the vector sum ($\sqrt{B_x^2+B_y^2+B_z^2}$).

In some examples, instead of taking the sum of the squares and the square root of the sum, the DSP 1256 converts the magnetic signals in the x, y and z directions to digital values and compares them to a table which indicates if the x, y, and z coordinates relate to a point outside of a sphere. In some examples, where only two coordinate axes are used, the DSP converts the magnetic signals to digital values and compares them to a table which indicates if the coordinates relate to a point outside of a circle. In further examples, the lookup table methodology is not limited to "circles" or "spheres" but can be used to implement any arbitrary or predetermined response desired. In other examples, a threshold may vary as a function of the phase of the resultant vector and therefore may describe any shape in 2D or 3D space.

Figure 13:
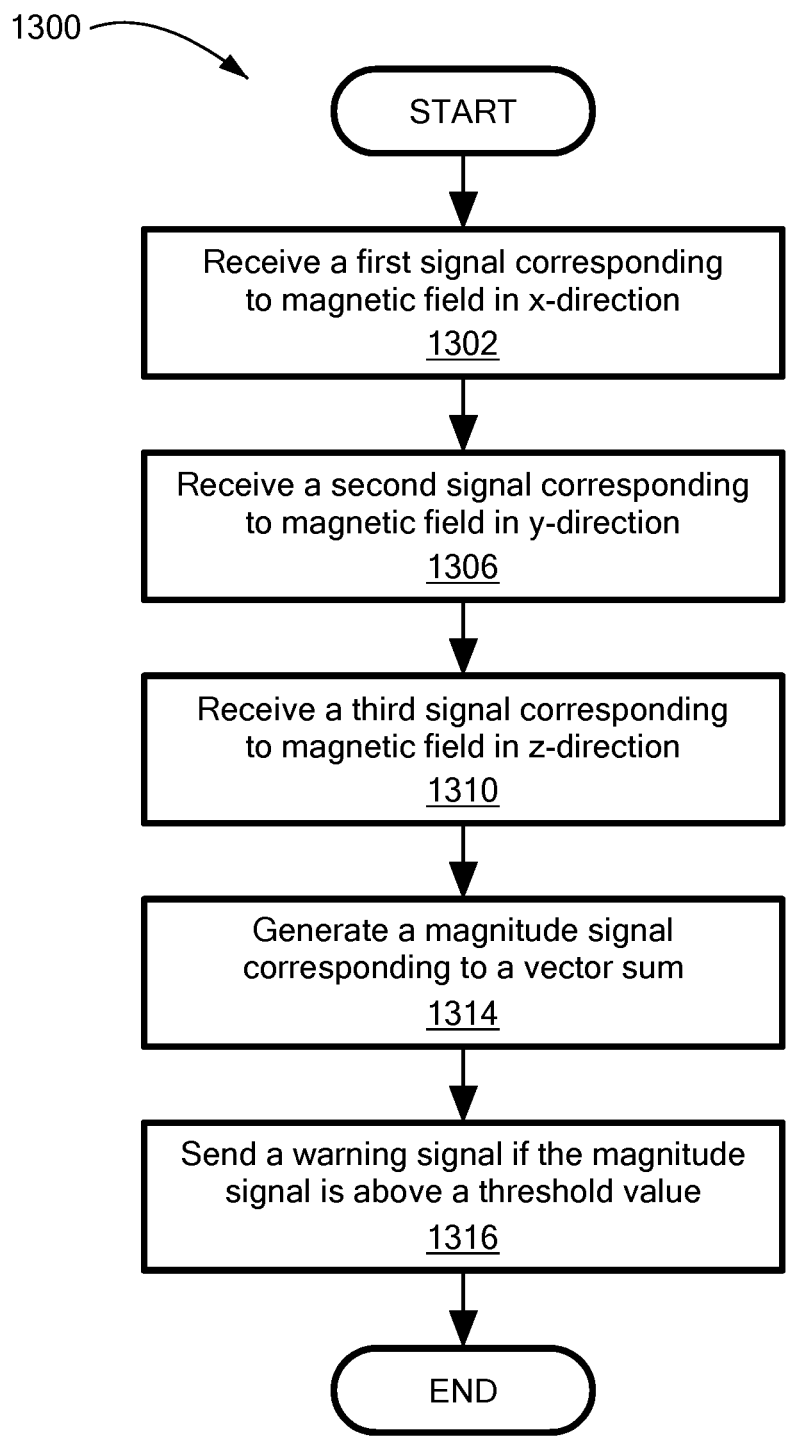
FIG. 13 is a flowchart of an example of a process to determine if a magnitude of a magnetic field is greater than a threshold voltage.

Referring to FIG. 13, a process 1300 is an example of a process to determine if a magnitude of a magnetic field is greater than a threshold voltage. Process 1300 receives a first signal corresponding to magnetic field in x-direction (1302). For example, the vertical Hall element 202 generates a first magnetic field signal (e.g., differential signals 210a, 210b) that is received by the processor 1202 after chopping.

Process 1300 receives a second signal corresponding to magnetic field in y-direction (1306). For example, the vertical Hall element 204 generates a second magnetic field signal (e.g., differential signals 212a, 212b) that is received by the processor 1202 after chopping.

Process 1300 receives a third signal corresponding to magnetic field in z-direction (1310). For example, the planar Hall element 202 generates a second magnetic field signal (e.g., differential signals 214a, 214b) that is received by the processor 1202.

Process 1300 generates a magnitude signal corresponding to the vector sum (1314). For example, the processor 1202 generates a magnitude signal 1210 corresponding to the vector sum of the first, second and third magnetic field signals.

Process 1300 sends a warning signal if the magnitude signal is above a threshold (1316). For example, the magnitude signal 1210 is sent to a comparator 1220 to compare the signal to a signal 1216 corresponding to a magnetic field threshold value. If the magnitude signal 1210 exceeds the signal 1216 a warning signal 1230 is generated.

Figure 14:
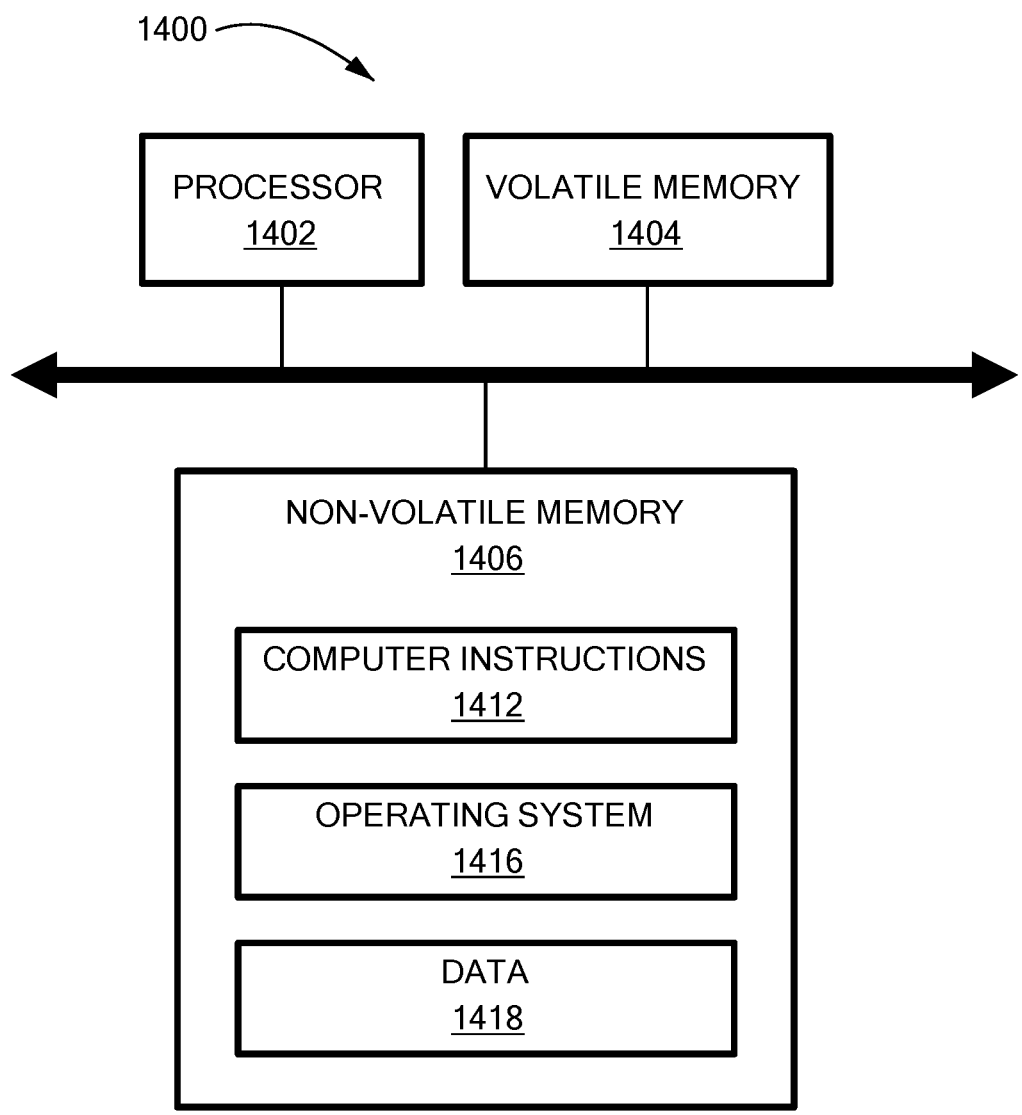
FIG. 14 is a simplified block diagram of an example of a computing device on which any portion of the process of FIG. 13 may be implemented.

Referring to FIG. 14, in one example, a computing device 1400 includes a processor 1402, a volatile memory 1404 and a non-volatile memory 1406 (e.g., hard disk). The non-volatile memory 1406 stores computer instructions 1412, an operating system 1416 and data 1418. In one example, the computer instructions 1412 are executed by the processor 1402 out of volatile memory 1404 to perform all or part of the processes described herein (e.g., process 1300).

The processes described herein (e.g., process 1300) are not limited to use with the hardware and software of FIG. 14; they may find applicability in any computing or processing environment and with any type of machine or set of machines that is capable of running a computer program. The processes described herein may be implemented in hardware, software, or a combination of the two.

The processes described herein are not limited to the specific examples described. For example, one of ordinary skill in the art would recognize that the techniques described herein may be used using only two of the three Cartesian axes. In other examples, the process 1300 is not limited to the specific processing order of FIG. 13. Rather, any of the processing blocks of FIG. 13 is combined or removed, performed in parallel or in serial, as necessary, to achieve the results set forth above.

The processing blocks (for example, in the process 1300) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, a programmable logic device or a logic gate.

All references cited herein are hereby incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor, comprising:
   first and second magnetic field sensing elements having respective first and second maximum response axes, the first and second maximum response axes pointing along respective first and second different coordinate axes, wherein, in response to a magnetic field, the first and second magnetic field sensing elements are operable to generate first and second magnetic field signals, the first and the second magnetic field sensing elements being chopped;
   a common circuit channel comprising a switched capacitor notch filter having a first notch at a frequency selected to remove products of the chopping; and
   an electronic circuit coupled to receive the first and the second magnetic field signals,
   wherein the electronic circuit is configured to:
     determine a magnitude of a vector sum of the first and the second magnetic field signals; and
     provide one or more signals in response to the magnitude of the vector sum determined.

2. The magnetic field sensor of claim 1, wherein the first and second coordinate axes represent orthogonal Cartesian coordinates.

3. The magnetic field sensor of claim 1, wherein the first magnetic field sensing element comprises a planar Hall element and the second magnetic field sensing element comprises a first vertical Hall element.

4. The magnetic field sensor of claim 1, wherein the first magnetic field sensing element comprises a first vertical Hall element and the second magnetic field sensing element comprises a second vertical Hall element.

5. The magnetic field sensor of claim 1, wherein the first magnetic field sensing element comprises a planar Hall element and the second magnetic field sensing element comprises a first magnetoresistance circuit.

6. The magnetic field sensor of claim 1, wherein the first magnetic field sensing element comprises a first magnetoresistance circuit and the second magnetic field sensing element comprises a second magnetoresistance circuit.

7. The magnetic field sensor of claim 1, wherein the first magnetic field sensing element is chopped with a chopping frequency of Fchop, and wherein the electronic circuit comprises a switched capacitor notch filter coupled to the first magnetic field sensing element and having a first notch at a frequency of Fchop.

8. The magnetic field sensor of claim 1, wherein the electronic circuit configured to provide one or more signals in response to the magnitude of the vector sum determined comprises an electronic circuit configured to provide a warning signal if the vector sum of the magnetic field exceeds a threshold value.

9. The magnetic field sensor of claim 8, wherein the electronic circuit configured to provide one or more signals in response to the magnitude of the vector sum determined comprises an electronic circuit further configured to provide a signal indicating the magnitude of the vector sum.

10. The magnetic field sensor of claim 1, wherein the electronic circuit configured to provide one or more signals in response to the magnitude of the vector sum determined comprises an electronic circuit further configured to provide one or more signals in response to the magnitude of the vector sum determined exceeding an adjustable threshold.

11. The magnetic field sensor of claim 1, wherein the electronic circuit configured to provide one or more signals in response to the magnitude of the vector sum determined comprises an electronic circuit configured to provide a signal indicating the magnitude of the vector sum.

12. A magnetic field sensor, comprising:
first, second, and third magnetic field sensing elements having respective first, second and third maximum response axes, the first, second and third maximum response axes pointing along respective first, second, and third different coordinate axes, wherein, in response to a magnetic field, the first, second, and third magnetic field sensing elements are operable to generate first, second, and third magnetic field signals, the first and the second magnetic field sensing elements being chopped;
a common circuit channel comprising a switched capacitor notch filter having a first notch at a frequency selected to remove products of the chopping; and
an electronic circuit coupled to receive the first, the second and the third magnetic field signals,
wherein the electronic circuit is configured to:
determine a magnitude of a vector sum of the first, the second and the third magnetic field signals; and
provide one or more signals in response to the magnitude of the vector sum determined.

13. The magnetic field sensor of claim 12, wherein the first, second, and third coordinate axes represent orthogonal Cartesian coordinates.

14. The magnetic field sensor of claim 12, wherein the first magnetic field sensing element comprises a planar Hall element, the second magnetic field sensing element comprises a first vertical Hall element, and the third magnetic field sensing element comprises a second vertical Hall element.

15. The magnetic field sensor of claim 12, wherein the first magnetic field sensing element comprises a planar Hall element, the second magnetic field sensing element comprises a first magnetoresistance circuit, and the third magnetic field sensing element comprises a second magnetoresistance circuit.

16. A magnetic field sensor, comprising:
first, second, and third magnetic field sensing elements having respective first, second and third maximum response axes, the first, second and third maximum response axes pointing along respective first, second, and third different coordinate axes, wherein, in response to a magnetic field, the first, second, and third magnetic field sensing elements are operable to generate first, second, and third magnetic field signals; and
an electronic circuit coupled to receive the first, the second and the third magnetic field signals,
wherein the electronic circuit is configured to:
determine a magnitude of a vector sum of the first, the second and the third magnetic field signals; and
provide one or more signals in response to the magnitude of the vector sum determined,
wherein the first magnetic field sensing element comprises a planar Hall element, the second magnetic field sensing element comprises a first magnetoresistance circuit, and the third magnetic field sensing element comprises a second magnetoresistance circuit,
wherein the first magnetic field sensing element is chopped with a chopping frequency of Fchop, and wherein the electronic circuit comprises a switched capacitor notch filter coupled to the first magnetic field sensing element and having a first notch at a frequency of Fchop.

17. The magnetic field sensor of claim 12, wherein the electronic circuit configured to provide one or more signals in response to the magnitude of the vector sum determined comprises an electronic circuit configured to provide a warning signal if the vector sum of the magnetic field exceeds a threshold value.

18. The magnetic field sensor of claim 17, wherein the electronic circuit configured to provide one or more signals in response to the magnitude of the vector sum determined comprises an electronic circuit further configured to provide a signal indicating the magnitude of the vector sum.

19. The magnetic field sensor of claim 12, wherein the electronic circuit configured to provide one or more signals in response to the magnitude of the vector sum determined comprises an electronic circuit further configured to provide one or more signals in response to the magnitude of the vector sum determined exceeding an adjustable threshold.

20. The magnetic field sensor of claim 12, wherein the electronic circuit configured to provide one or more signals in response to the magnitude of the vector sum determined comprises an electronic circuit configured to provide a signal indicating the magnitude of the vector sum.

21. A method comprising:
receiving a first magnetic field signal from a first magnetic field sensing element;
receiving a second magnetic field signal from a second magnetic field sensing element, the first and second magnetic field sensing elements having respective first and second maximum response axes, the first second and second maximum response axes pointing along respective first and second different coordinate axes, wherein, in response to a magnetic field, the first and second magnetic field sensing elements are operable to generate the first and the second magnetic field signals;

determining a magnitude of a vector sum of the first and the second magnetic field signals comprising:

converting the first, second and third magnetic field signals to digital values;

using the digital values to look up values in a table to determine if the vector exceeds a predetermined response; and providing one or more signals in response to the magnitude of the vector sum determined.

22. The method of claim 21, further comprising receiving a third magnetic field signal from a third magnetic field sensing element, wherein the third magnetic field sensing element having a third maximum response axis, the third maximum response axis pointing along respective the third different coordinate axis, wherein, in response to a magnetic field, the third magnetic field sensing element is operable to generate the third magnetic field signal, wherein determining a magnitude of a vector sum of the first and the second magnetic field signals comprises determining a magnitude of a vector sum of the first, the second and the third magnetic field signals.

23. The method of claim 22, wherein receiving the first magnetic field signal from the first magnetic field sensing element comprises receiving the first magnetic field signal from a planar Hall element, wherein receiving the second magnetic field signal from the second magnetic field sensing element comprises receiving the second magnetic field signal from a first vertical Hall element, and wherein receiving the third magnetic field signal from the third magnetic field sensing element comprises receiving the third magnetic field signal from a second vertical Hall element.

24. The method of claim 21, wherein providing one or more signals in response to the magnitude of the vector sum determined comprises providing a warning signal if the vector sum of the magnetic field exceeds a threshold value.

25. The method of claim 24, wherein the threshold value is adjustable by a user.

26. The method of claim 24, wherein providing one or more signals in response to the magnitude of the vector sum determined comprises providing a signal indicating the magnitude of the vector sum.

27. The method of claim 21, wherein providing one or more signals in response to the magnitude of the vector sum determined comprises providing a signal indicating the magnitude of the vector sum.

* * * * *

UNITED STATES PATENT AND TRADEMARK OFFICE
CERTIFICATE OF CORRECTION

PATENT NO. : 9,897,464 B2
APPLICATION NO. : 15/638876
DATED : February 20, 2018
INVENTOR(S) : Joseph James Judkins, III et al.

It is certified that error appears in the above-identified patent and that said Letters Patent is hereby corrected as shown below:

In the Specification

Column 2, Line 28, delete "first second and second" and replace with --first and second--

Column 3, Line 48, delete "II/I-V" and replace with --III-V--

Column 5, Line 9, delete "field sensor" and replace with --field sensors--

Column 8, Line 2, delete "stored threshold" and replace with --stored thresholds--

Column 8, Lines 16-17, delete "used compensate" and replace with --used to compensate--

Column 8, Line 46, delete "thresholds stores" and replace with --thresholds, stores--

Column 9, Line 22, delete "to be sample is" and replace with --to be sampled is--

Column 9, Lines 66-67, delete "first and second and comparators" and replace with --first and second comparators--

Column 12, Line 15, delete "sensitivity just" and replace with --sensitivity adjust--

Column 12, Line 56, delete "chopping as described" and replace with --chopping is described--

Column 13, Line 2, delete "a two instances" and replace with --at two instances--

Column 13, Line 40, delete "file" and replace with --filed--

Column 14, Line 30, delete "either in the" and replace with --either the--

Signed and Sealed this
Twenty-fifth Day of September, 2018

Andrei Iancu
*Director of the United States Patent and Trademark Office*

In the Claims

Column 18, Lines 65-66, delete "the first second and second" and replace with --the first and second--

Column 19, Line 19, delete "along respective the third" and replace with --along a respective third--